United States Patent
Blasco Claret

(10) Patent No.: US 9,647,150 B2
(45) Date of Patent: May 9, 2017

(54) MONOLITHIC INTEGRATION OF PLENOPTIC LENSES ON PHOTOSENSOR SUBSTRATES

(71) Applicants: Jorge Vicente Blasco Claret, Valencia (ES); Isabel Lena Blasco Whyte, Valencia (ES); Carmen Victoria Blasco Whyte, Valencia (ES); William Jorge Blasco Whyte, Valencia (ES)

(72) Inventor: Jorge Vicente Blasco Claret, Valencia (ES)

(73) Assignees: Jorge Vicente Blasco Claret, Valencia (ES); Isabel Lena Blasco Whyte, Valencia (ES); Carmen Victoria Blasco Whyte, Valencia (ES); William Jorge Blasco Whyte, Valencia (ES)

( * ) Notice: Subject to any disclaimer, the term of this patent is extended or adjusted under 35 U.S.C. 154(b) by 0 days.

(21) Appl. No.: 14/892,854

(22) PCT Filed: Dec. 7, 2013

(86) PCT No.: PCT/ES2013/070855
§ 371 (c)(1),
(2) Date: Nov. 20, 2015

(87) PCT Pub. No.: WO2014/188018
PCT Pub. Date: Nov. 27, 2014

(65) Prior Publication Data
US 2016/0133762 A1    May 12, 2016

(30) Foreign Application Priority Data

May 21, 2013    (ES) .................................. 201330727

(51) Int. Cl.
*H01L 31/02*    (2006.01)
*H01L 27/14*    (2006.01)
(Continued)

(52) U.S. Cl.
CPC .... *H01L 31/02327* (2013.01); *G02B 13/0085* (2013.01); *H01L 27/14618* (2013.01);
(Continued)

(58) Field of Classification Search
CPC ......... H01L 31/02327; H01L 27/14618; H01L 27/14625; H01L 27/14627; H01L 27/14685; G02B 13/0085
See application file for complete search history.

(56) References Cited

U.S. PATENT DOCUMENTS 5,910,940 A * 6/1999 Guerra ................... B82Y 10/00
                                                          369/112.24
7,391,576 B2 * 6/2008 Vigier-Blanc .... H01L 27/14618
                                                          257/E31.118
(Continued)

*Primary Examiner* — Ida M Soward
(74) *Attorney, Agent, or Firm* — Lucas & Mercanti, LLP

(57) ABSTRACT

A monolithic integration of a plenoptic structure on an image sensor is provided using material with low refractive index on the substrate of photosensors and arranging material with a high refractive index on the material with low refractive index to create the plenoptic microlenses. Plenoptic lenses are created directly on the substrate of photosensors. Photosensors with a high integration density are arranged at minimum distances to minimize inter-pixel interferences and on the integration density end having "deformed square" geometries on the vertices adjacent to a pixel of the same color, removing any photosensitive area from the vertices. The light efficiency is increased by structures of plenoptic microlenses at variable distances from the substrate, with more asymmetric profiles on the periphery, or pixels of different sizes and shapes towards the periphery of the sensor. Micro-objectives are produced by the creation of alternate layers of low and high refractive index.

20 Claims, 22 Drawing Sheets

(51) Int. Cl.
  *G02B 13/00* (2006.01)
  *H01L 31/0232* (2014.01)
  *H01L 27/146* (2006.01)
  *H04N 5/225* (2006.01)
  *H04N 9/04* (2006.01)
(52) U.S. Cl.
  CPC .. *H01L 27/14625* (2013.01); *H01L 27/14627* (2013.01); *H01L 27/14685* (2013.01); *H01L 2924/0002* (2013.01); *H04N 5/2257* (2013.01); *H04N 9/045* (2013.01)

(56) References Cited

U.S. PATENT DOCUMENTS

| | | | |
|---|---|---|---|
| 8,222,069 B2* | 7/2012 | Park | H01L 27/14627 257/294 |
| 8,415,607 B2* | 4/2013 | Duerksen | H01L 31/1055 250/208.2 |
| 8,593,564 B2* | 11/2013 | Border | H04N 5/23212 348/340 |
| 9,030,550 B2* | 5/2015 | Georgiev | H04N 5/2254 348/135 |
| 9,128,228 B2* | 9/2015 | Duparre | B29D 11/00298 |
| 9,197,798 B2* | 11/2015 | Georgiev | H04N 5/2254 |
| 2005/0270667 A1* | 12/2005 | Gurevich | G02B 3/0056 359/754 |
| 2006/0050398 A1* | 3/2006 | Gurevich | G02B 3/0056 359/622 |
| 2011/0043917 A1* | 2/2011 | Bayramian | G02B 27/0927 359/569 |
| 2011/0057277 A1* | 3/2011 | Yu | H01L 27/14629 257/432 |
| 2011/0122467 A1* | 5/2011 | Futterer | G02F 1/133524 359/9 |
| 2016/0173844 A1* | 6/2016 | Knight | H04N 9/04 348/222.1 |

\* cited by examiner

Section I-I

MONOLITHIC INTEGRATION OF PLENOPTIC LENSES ON PHOTOSENSOR SUBSTRATES

CROSS REFERENCE TO RELATED APPLICATION

This Application is a 371 of PCT/ES2013/070855 filed on Dec. 7, 2013 which, in turn, claimed the priority of Spanish Patent Application No. P201330727 filed on May 21, 2013, both applications are incorporated herein by reference.

1. TECHNICAL FIELD

The invention disclosed herein is related to image capture, more specifically with capturing plenoptic images with, a solid-state sensor, where not only is the image captured, but also the direction of arrival of the light rays. This field comprises optical elements, optoelectronic sensors (that convert light intensity into electrical current) and processing elements of the captured images. It is aimed at reducing costs of production of image sensors while increasing its quality, reducing its size and offering the manufacturing capacity at very high volumes. The invention provides to optical designs at wafer level and the creation of "sandwiches" of several optoelectronic and optical wafers, resulting in sensors that can be used in digital cameras, mobile phones, tablets, laptops and general consumer goods that incorporate cameras, especially but not exclusively in combination with CMOS image sensors. Various structures of the image sensor and method of making are described herein.

2. PRIOR ART

"Monolithic integrated circuits" after referred to those obtained using common chip design techniques, in which the base material (substrate) contains not only the active elements (transistors, sensors, etc.) but also the elements of interconnection. The use of this term refers to the integration of technologies and functions which are usually different, for example the use of analog and digital circuits on the same chip, or the integration of power semiconductors with analog, digital circuits, signal processing, sensors and protection circuits on the same chip.

In optoelectronics, "monolithic integration" refers to the tendency to integrate into a single "electro-optical integrated circuit" features such as optical fiber input/output optical waveguide on-the chip itself, usually made of "electronic materials", lasers, detectors, and all with their electronic bias circuits, control and management system.

In a normal camera, the film (or the sensor in a digital camera) captures a two-dimensional image where each point of the film (or pixel sensor in a digital camera) integrates all the rays of light that reach a point from any direction. A plenoptic camera (or light field camera) is able to sample a range of light and also the direction of the rays of light in a light field.

The capture of the direction of arrival of light synthesizes "new view" or new images such as 3-dimensional images, images re-focused on different points and images "completely focused" (regardless of the distance of objects in the real world).

FIG. 1 (reproduced from U.S. Pat. No. 8,290,358 B1; inventor Todor G. Georgiev) illustrates an implementation of the prior art, an array of cameras (with two or more lenses or objectives, in the case of the figure three lenses on the top portion of the figure) part. Each lens/objective focuses images of the real world in a particular part of the photosensor (thin film on the bottom of the image), although it would also be possible to do so in several photo-sensors. The number of captured images can be combined to form a single image.

FIG. 2 (again reproduced from U.S. Pat. No. 8,290,358 B 1) illustrates a second implementation of the prior art of a plenoptic camera, that uses a single objective or lens (at the top of the image) and a set of microlenses (or array of microlenses) which can for example include 100,000 lenslets (or many more in recent implementations) located one next to the other forming a two-dimensional pattern (the array of microlenses, marked with an arrow in FIG. 2, is located in this figure at the point where the three beams cross). Said array of microlenses is typically located at a small distance (about half a millimeter) of a photo-sensor (bottom part of the image) which may be a CMOS (Complementary Metal Oxide Semiconductor) sensor, CCD (Charge Coupled Device) sensor or any other photo-sensor technology past, present or future. The plane of the array of micro-lenses is parallel to the plane of the photo-sensor.

The image captured by the plenoptic camera sensors described in the previous paragraph is actually a collection (array) of small images of the lens/primary objective of the camera, the images are often called "micro-images." The structure "micro lens/sensor" described at each point captures not only the brightness but also the light intensity distribution in different directions. Each of the several microlenses separates the beam from the main lens coming to it as rays from different positions of the main lens. Light rays are stored as pixels in the photo-sensor, and the set of pixels on each micro-lens forms an image of n-pixels called macro-pixel (marked with a key in FIG. 2).

A third type of "light field camera" is similar to that of FIG. 2, except that the microlens array is replaced by an array of apertures (small holes on an opaque surface that let light in). A fourth type of "plenoptic cameras" is similar to that of FIG. 2 except that a no refractive "sinusoidal-mask" replaces the microlenses, said mask modulates the incident light but does not refract it, resulting in the captured image which is the convolution of the light field incident with the light field mask; this camera captures the light field directly in the frequency domain of Fourier. Thus, a two-dimensional (2D) sensor pixel represents a linear combination of several encoded incidents rays, said linear combination can be decoded by software to obtain all of the information of the light field (including the arrival direction of the ray).

FIGS. 3 and 4 (reproduced from GB 2,488,905, inventors Norihito Hiasa and Koshi Hatakeyama) illustrate the propagation of the light rays and the source of algorithms that can be used for various tasks such as refocusing, the calculation of distances, etc. FIG. 3 illustrates the case where a pair of points of the target plane come to focus in a plane which is positioned beyond the plane of the microlenses, however, these rays never reach focus, they are diffracted by the microlenses and give rise to several pixels in the sensor (instead of a single pixel in the plane that would be focused). FIG. 4 illustrates the case in which a couple of points in the plane object comes to focus on an earlier plane of the microlenses and from that point diverge, are diffracted by the microlenses and result in several pixels in the sensor plane. In both cases, if the sensor (or film) were in the place where the microlenses are, the image of these points would appear blurred; however, with a plenoptic camera, where you can determine the direction of arrival of the rays, there are multiple algorithms to calculate what would be the focused image of the items described in FIGS. 3 and 4, calculating the "backtracking" of the light rays (from the image sensor in the space to the right of the main lens up to the focal plane, and even the origin of these rays in the object space, to the left of the lens). Due to similarity of triangles of space with the object image space, it is also possible to calculate the distance from the focal plane (201) to the planes described in FIGS. 3 and 4 (101, 102 and 202), it is even possible to calculate the distance between pixels of an image to the origin of these pixels in the object space, with this information it is then possible to create images for 3-dimensional (3D) televisions images, refocus images produce images completely focused, etc.

Although we have described the plenoptic camera with later implementations, it was already described in 1908 by Lippman, but technological difficulties did not allow significant progress until 2004, when Ng, Hanrahan, Levoy and Horowitz in his patent US 2007/025074 (and as in the "Stanford Tech Report" CTSR 2005 February) described a camera whose resolution was the same as the number of microlenses used. In October 2004 Ng, Hanrahan, Levoy and Horowitz (U.S. 2012/0300097) describe a plenoptic sensor with a structure similar to that described in FIGS. 2, 3 and 4. We reproduce said sensor in FIG. 6.A, discuss their main parts. The lower part of the image describes the whole assembly, while the upper part of the image describes the various parts of said assembly. The "Digital back" provides mechanical strength to the set, while carrying out the functions of the printed circuit board where the "Chip package" (with their respective chip input-output pins that plug into the "Digital back") is plugged in, the chip includes "Photosensor", and including a "Base Plate" (or base) mounted on the Photosensor, as well as a "Microlens array" (or array of microlenses) mechanically fixed to a "Lens holder", this is attached to the "Baseplate" (base), with "Separation springs" maintaining a certain distance between the microlenses and the photo-sensor, a "Adjustment screws" (or screws) located in three positions control the distance and parallelism of the planes of photo-sensors and micro-lens array. This figure does not show the main camera lens.

The ideas expressed in the above patents gave light to the early plenoptic cameras oriented to the consumer market, in 2012 the company Lytro began marketing the camera whose scheme is shown in FIG. 6.B, the company whose workforce included one of the inventors of the aforementioned patents. The FIG. 6.B (extracted from www.lytro.com) shows on its top part a set of input lenses (zoom of 8× and fixed aperture f/2), a "light field sensor" with similar concepts to those of FIG. 6.A (with a "microlens array" and a "digital image sensor"), and at the bottom of the image the "Light field engine" (consisting of some processing capacity to implement plenoptic algorithms briefly mentioned in the previous paragraphs (fundamentally re-focusing on early versions of the product)).

In 2008 Lumsdaine, Georgiev and Intwala described a design with a higher specification in terms of effective resolution (until then only one pixel per microlens) in the aforementioned patents ("A. Lumsdaine and T. Georgiev. Full resolution Lightfield rendering. Technical report, Adobe Systems, January 2008", and the US 2009/0041448 patent).

In October 2009 Georgiev described (U.S. 2010/0020187) a different variant in which a conventional camera (with its main lens located in front of the sensor) is added several lenses and several prisms are added (the set of lenses/prisms obtains different views of the same image and directs it towards the sensors through the main lens). This patent provides pictures of the set of lenses/prisms (attached as FIG. 5.A) and the set "lenses/prism/main lens" assembly mounted in a camera (FIG. 5.B). The images obtained through the various input lenses are combined to sample the "light field".

With priority date in October 2009, DiFrancesco Selkirk, Duff, VandeWettering and Flowers, in the US 2011/0169994 patent, describe a slightly different optics (see FIG. 7A) in which the "Microlens array" ("Lenslet Array" or "array of micro-lens") stands at the front of a lens system, but with an input lens between said lens array and object space. The practical implementation of said lens system (FIG. 7B) is described with a "head tube" containing lenses with larger diameters and a "tail pipe" with lenses of smaller diameter in the area proximal to the connection of said optics to the camera. The array of microlenses and the input lens are added to said structure to the introduction of a third tube (as described in FIG. 7.C). The principles and algorithms used in the structure are similar to those used in the structures described above: "obtaining a sample of the light field from multiple images".

Apart from the above-mentioned possible positioning implementations being the objective, from prototype to market-oriented consumer products, through prototypes that pursue very high optical quality for sophisticated applications, there was a simultaneous trend towards reduction of volumes and costs manufacturing. In February 2001 Ueno, Funaki and Kobayashi (US Patent 2012/0218448) describe an "imaging device implemented in solid state", in actuality is a small module for a camera (see FIG. 8. A), including an input lens 12 which sends the light to a "microlens array" 14 (including a transparent substrate 14b and the microlenses themselves 14a) and is eventually sent to an "image capture element" 16 containing pixels, such as photodiodes, which convert light energy into electrical energy, said element is formed by a semiconductor substrate 16a, bias circuits and reading (not shown in Figure) that provide electric power and read the pixels 16b formed in the substrate 16a, color filters 16c (e.g. red, green or blue) corresponding to each pixel 16b, arranged in standard formats such as the Bayer format, and finally a small micro-lens 16d optional on each color filter, whose task is concentrating the light beam incident on each of the photo-sensors (pixels 16b). At the top of the set "semiconductor substrate/colored filters/pixel micro-lenses", but outside the area of the photo-sensors, there are "resin spacers" 42, which aims to maintain the distance between the photosensors 16 and the microlenses 14, they are part of a set that includes a "light transparent substrate" 40, which may be made of material that lets visible light pass but eliminates infra-red light or near infra-red; in the semiconductor substrate there are "reading and bias electrodes" 44 for pixels 16b, such electrodes are connected by metal columns 46 which vertically cross the semiconductor substrate 50 by means of the "contact points" 48; the chip 50 may contain the bias circuits and processing of the photo-sensors (pixels). The input lens 12 is placed in position by means of a cylinder 62, which is held in position by a support 64 placed on the transparent substrate 40; a "protective frame against external light" 52 externally mounted to said structure as an outer cover of the entire structure, to prevent entry of light from the substrate 16A or the chip 50, said cover is only interrupted by the electrodes 54, which electrically connect said structure to the exterior electronics system. This patent (namely the "Claim" 1) claims a solid-state imaging system comprising: a semiconductor sensor comprising blocks of pixels and these pixels; a first optical system (represented in the figure by the lens 12); a second optical system (represented in the figure by the microlenses 14) and establishes that the plane of imaging the first optical system (lens 12) when the object is located at infinite distance should be within a distance of the first optical system (lens 12) greater than the distance between the first optical system (lens 12) and the image sensor (16).

In March 2011, Ueno, Iida and Funaki, in his patent US 2012/0050589 (see image reproduced in said patent 8.B) reveal slightly different structures to those described in the previous paragraph, for example, with the microlenses facing the input lens system (instead of facing the sensor) and/or adding color filters (e.g. red, green and blue) in the micro-lens and in the sensor, forming certain patterns, such as the Bayer pattern) so that their image sensors also capture the colors, and describing methods for making such structures where color filters (and their associated sensors) are diverted to the periphery of the imaging area (see FIG. 8.B), with major deviations as they get the closer to the periphery.

Progress in manufacturing processes for monolithic sensors, micro-electronics and optics as part of a single dice is also shown in October 2009 by Brueckner, Duparré, Wippermann, Dannberg and Brauer in his patent US 2011/0228142 A1, one of whose implementations are reproduced in FIG. 8.C. is not a plenoptic structure, it only allocates microlenses 10 in groups of photo-sensors 30' contained in a substrate 100, creating "3D space observation cones" (seen in lines 410), truncated at its narrowest part (located on the microlenses) and widening with the distance, with some overlap in their fields of vision in object space. To avoid noise from optical coupling between the different optical channels (crosstalk) associated with each micro-lens 10 there are opaque layers 11, 12 and 12' with openings to just let a suitable beam of light through. The transparent substrates 20, 21 and 22 are constructed of glass, plastic or inorganic copolymers (e.g. ORMOCER). The focal length of microlenses coincide with the distances between the microlenses 10 and the sensors 30', reaching for these focal distances between 30 and 3000 microns, with diameters of micro-lenses between 10 and 1000 microns, a number of microlenses 4 and 25,000 and a number of between 10,000 and 10 Mega pixels or higher. The sensors 30' create several micro-images (between 4 and 25,000) that are subsequently combined by additional hardware or software. The main advantage of this structure is its low volume, since no additional lens is not required, being designed for portable applications, and it lends itself to high-volume manufacturing processes.

The history of the light field cameras has been a parallel evolution of three fields, optics (as explained above), algorithms (which, starting from the pixels of the photo-sensors images with new features are formed: different focus, totally focused, 3D images, etc.) and microelectronics/micro-optics, photo-sensors getting increasingly more evolved features (in terms of number of megapixels, luminosity, contrast, etc.). The initiatives described in the preceding two paragraphs were among the first where the processing and manufacturing of the optical elements used similar techniques as those used in microelectronics, leading to manufacturing techniques at wafer level to drastically reduce the costs, while providing quality levels and very high reproducibility. However, the formation of microlenses and color filters on the semiconductor photodiode panels has been used in recent decades with a similar structure as that of FIG. 10.A (reproduced patent US 2012/0012959 A1; inventor Po-Shuo Chen), showing a typical representative sensor of the prior art in the CMOS (Complementary Metal Oxide Semiconductor) technology: from bottom-up we can distinguish a semiconductor substrate where in the interior there are three photo-sensors are shown (the right one marked with arrows), the semiconductor is protected by a thin layer of silicon nitride, on said substrate color filters R (Red-Rojo), G (Green-Verded) and B (Blue-Azul) are placed, while system of basic colors like cyan, yellow and magenta could be used; finally on top there are three micro-lens, built with optical materials that concentrate the light towards the photo-sensors, increasing the luminous efficiency of the structure (usually in most publications on optics, the sensor is represented by a simple flat photosensitive plane, like a traditional film with a photo-sensitive continuous layer with photosensitive elements of infinitely small dimensions, but in reality the pixels of each photo-sensor are a discrete size and there are spaces between them to separate them and hold bias circuits and reading, hence the usefulness of the microlenses mentioned above). Color filters are typically fabricated by photolithographic methods, in which each photosensitive color layer is deposited, partially exposed to light (with a pattern of negative shading photo-lithographic masks) and etched (developed), but also it can be formed by jet printing. The microlenses (usually made with thermo-plastic resins or photo-resistive transparent material) are often formed by depositing such materials followed by photolithography and heating process, hardening by heat reflux, and curing.

In July 2010, Po-Shuo Chen described a structure with better features in the patent US 2012/0012959 (FIG. 10.B) where color filters are separated between them and the array of microlenses presents no gaps between adjacent microlenses, a top view (FIG. 10.C) shows the polygonal structure of said color filters (with gaps between them in the horizontal and vertical directions (X1, Y1) lower than the diagonal direction (D1). The benefits of such structure to avoid "crosstalk" (crosstalk between colors) are evident, besides this structure avoids the gaps between microlenses and thus increases the light efficiency. Chen also explained that this structure (with gaps between color filters) opens the possibility of a new manufacturing method for microlenses based on deposition and thermal processing, whereby it opens the flexibility of using transparent materials that are not photo-resistive, such as thermo-plastic resins. Obviously, a photolithographic processing of each micro-lens will allow higher precision based on the material processed by deposition and subsequent heat treatment, however the process adds flexibility in the choice of materials.

Another notable progress has been in lighting sensors, evolving from a FSI (Front Side Illumination) technology, BSI (Back Side Illumination) technology, the difference between the two is illustrated in FIG. 9: in a standard CMOS process (FIG. 9 A, FSI) the silicon process is carried out to create photo-sensors and therefore the area between different photo-sensors as well as the area on them is used for the metal layers that carry different electrical signals (bias and reading photo-sensors, power supply voltages, etc.), these metallization layers provide opaque structures which deteriorate the luminous efficiency of the sensor; the solution to this problem is immediate, connections and metallizations are performed on the opposite side of the substrate where photo-sensors have been created (FIG. 9.*b*) thus eliminating the opaque layers between the photo-sensor and the color filter, thereby improving luminous efficiency. Anecdotally it is worth mentioning that in the promotional materials of Apple iPADs they reveal that their cameras have among other features rear lighting or BSI. Other advantages provided by the BSI technology are the allowance of optical modules of smaller dimensions, allowing wider openings (faster lenses) and allowing designing zooms of highest quality.

Up to now we have described the first plenoptic initiatives undertaken with large size discrete optics, the first initiatives that place one array of micro-lenses at very small distance from CMOS or CCD sensors, other initiatives that place the microlenses as an add-on module added to the external objectives of the camera, and finally the first step towards a monolithic integration and wafer processing, where the microlenses are placed on a transparent substrate by spacers on the resin substrate on which the sensors are manufactured, for example CCD sensors or photo-sensors in a CMOS fabrication process on a semiconductor substrate.

One of the main improvements of the inventions set forth herein is that we go a step further towards monolithic integration, leading to structures processed on a single wafer, instead of optical and electronic structures processed in different wafers and after coupled by spacers, leading to better optical characteristics and production methods of lower cost and higher quality.

There has also been a rapid review of the state of the art of photo-sensors, especially sensors in CMOS technology, more and more megapixels, evolving into structures BSI (Back Side Illumination), with filters of increasingly sophisticated colors and structures that position a micro-lens positioned above each photo-sensor face to concentrate the light in the active area, avoiding wasting energy incident on the semiconductor area which contains only bias circuits or reading.

Finally, before moving on to in the description of the invention, several trends of complete mounting assembly of the optics and their respective sensors will be reviewed. First, a plenoptic sensor installed in a commercial camera (present or future) which could have normal targets as described in FIG. 7B (or lesser or greater sophistication, fixed objectives or zooms), the only difference from a current camera (besides the micro-lenses of the plenoptic sensor) is the post-processing of the recorded pixels on the sensor. Second, cameras commercially available today (and future cameras) may have micro-lenses mounted on an external objective as described in FIG. 7.C (or similar). These trends provide a high definition camera in terms of number of megapixels (because it is relatively simple to manufacture many megapixels on a sensor whose horizontal and vertical dimensions are several square centimeters) and high optical quality thanks to the large lenses, which will ensure a low optical aberrations and high luminous efficiency. This segment will cover the niche market of medium, high and very high prices, arriving at the end to professional solutions of high quality for TV and cinema.

An intermediate end for quality and cost is exemplified in FIG. 11 where it can be seen at the bottom a "flexible circuit" on which is a photo-sensor chip mounted (similar to those described above, but in this image an encapsulation for connection to external electronics and a small transparent glass on top of the chip is included, which aims to let in light while preventing the penetration of dirt, dust and moisture in the area of photo-sensors). This chip is housed in a mechanical structure that aligns the sensor with several lenses, resulting in a module, which aims to be housed in mobile phones, laptops and other small consumer devices. The typical price of these modules is very low, as they are intended to be part of consumer goods that are produced by millions (mobile computers and smartphones) whose price should be affordable to a large number of people.

The structure described above, despite their relatively low cost, implies a non-negligible mechanical and assembly complexity, even thanks to the use of robotic or automated assembly techniques the price of a large number of lenses in the mechanical structure described is relatively high compared to similar structures that can be assembled using processing techniques similar to those employed in microelectronics or micro-optics. Following this trend, in November 2007, Weng and Lin described (in US 2009/0134483 A1) a compact camera module, reproduced in FIG. 12, comprising a photo-sensor chip (102), a set of lenses (126) and an outer shell with electrically conductive material (134). The module includes a substrate 100 which may be of silicon or another semiconductor material, and may contain a CCD image sensor or CMOS, a transparent substrate 160 located on the semiconductor substrate 100 and an array of micro-lenses 104 located between the two structures, the CCD or CMOS sensor contains an array of opto-electronic components 102 such as photodiodes or phototransistors, built in the substrate 100 by typical semiconductor techniques. At least one land pin (I/O pin) 114b is connected to the semiconductor substrate 100 and the conductive layer 101 formed on the substrate using microelectronic fabrication techniques. Also a set of pin 114a is positioned to take outside readings of photo-sensors. Both ground pins as the pins of the photo-sensors are isolated electrically from the substrate by a dielectric layer 112. On the semiconductor substrate 100 a transparent substrate 160 (glass or quartz) is deposited, forming a cavity 160b on the sensors 102 and their respective microlenses 104. On the transparent substrate 160 a set of lenses 126 is placed, then a conductive layer is thereafter positioned on the semiconductor substrate 134 and the lens, whose function is to protect all sensory structure against interference from electromagnetic noises, since this layer is grounded through the layer 101 and the pin 114b. Further, an opaque layer 136 can be used (which may be as simple as a simple opaque paint) on the conductive layer 134 in order to obtain a better luminous insulation structure. To increase immunity to external electromagnetic radiation structure a transparent conductive layer 130 can be used on top of the structure formed by materials such as IZO (Indium Zinc Oxide, Zinc Indium Oxide) or ITO (Indium Tin Oxide, Indium Tin Oxide). This patent also describes a manufacturing method based on wafer processing, allowing production of large quantities of camera modules at very low prices, for example, not only are such techniques used to manufacture the sensors, but also to placing glass wafers or quartz wafer 160 on the semiconductor substrate 100, or to position lens 126 on the wafer substrate 160, or to deposit a transparent conductive layer 130 over all sub-modules built in a wafer. Finally, this structure may be subjected to a cutting process (dicing), or separation of each of the sub-modules built on a wafer, then the usual techniques of microelectronics packaging are used, such as BGA (Ball Grid Arrays) or "solder balling" at the bottom of the chip, normally available in modern packaging high density chips (represented in the figure with numbers 118b and 118a), allowing a very high and dense number of entry and exit pins, very convenient to quickly dump outside an increasing number of mega-pixels with new CMOS technology more commonly used in high-density sensors.

T. Y. Lin, C. Y. Cheng and H. Y. Lin described in May 2007 from novel modules in patent US2011/292271 A1 (reproduced in FIG. 13), the bottom of the figure includes solder balls to connect the module to a printed circuit module, photo-sensors 300 (CMOS or CCD) modules on which is deposited an array of micro-lenses 302 similar to those described above, whose purpose is to concentrate light on the active area of each photo-sensor, on said structure a transparent substrate materials such as glass, quartz or other transparent material has been placed. This structure is similar to that of any other CCD or CMOS sensor, but from here a planar structure 112 is placed consisting of a dry photo-resistive film (dotted area), very similar to that commonly used in micro-electronic processes but with characteristics of high adhesiveness, said layer, whose thickness can be controlled at will depending on the distances designed between the sensor and the lens is subjected to a photolithographic process and attacked, leading to a structure with an empty space (112a) between the transparent substrate and the lenses 10; lens (10) is formed by a substrate 100 and two elements 102 and 104 in the two opposite surfaces of the substrate 100 (which in the image are convex but it could be concave) lenses are made of organic materials such as glass, epoxy, acrylates or silicone; the mechanical link between the different layers is carried out by heating processes. More lenses can be added to said structure by depositing new layer of photo-resistive material (206 and 214) and their selective etching to form gaps of spacing between the lenses (206a and 214a), finally placing a transparent substrate 216 in the top of the structure. The manufacturing process described lends itself to wafer processing, with the first wafer containing photo-sensor, on which the pixel microlenses 302, and from that structure several lenses are built, one after another on all sensors of the wafer, finally proceeding to the cutting process (dicing or obtaining a dice) from which a large number of camera modules are derived.

The process described in the previous paragraph dramatically reduces manufacturing costs and is especially useful when compared with the alternative of using glass spacers between the lenses or between the sensor and the first lens, especially considering that for technological reasons glass separators can not reach thicknesses below 300 microns (by the present invention thicknesses up to about 30 microns are achieved, giving more flexibility to the designer of lenses, by reducing the thickness of the assembly and avoiding the use of adhesive materials for the structure.

The CCD sensors are used and have been used in digital cameras and many applications, however, the CMOS sensors have increased in popularity because of their cheaper production costs, higher yields in their manufacturing processes (percentage of parts fulfilling specifications) and smaller sizes, all thanks to the use of technology and equipment developed for manufacturing semiconductor (microprocessors, memories and logic circuits) equipment.

In parallel to the cited progress, and in a field of different principle meta-materials have evolved, such materials include small-scale structures designed for handling electromagnetic waves, and already in 1967 Victor Veselago theorized about the possibility of materials with negative index of refraction in his article "The electrodynamics of substances Simultaneously With negative Values of $\in$ and $\mu$" [1]. In 2007 Henry Lezec obtained a negative refraction in visible light [2] and since then various groups have theorized about the possibility of the use of these materials for applications such as invisibility or microscopes with magnifying power far beyond the state of the art.

3. DETAILED DESCRIPTION

The following description reflects particular ways of implementing the inventions, but its main purpose is to illustrate the principles of the inventions and should not be taken in a limiting sense. The scope of the invention is best determined by reference to the claims of this document.

In addition to the definitions of monolithic integrated circuits described in the prior art, the term monolithic extends in the present invention to electro-optical sensors incorporated into a single structure, mainly processed by methods commonly used in microelectronics and/or micro-optics, not only the photo-sensors (typically CCD or CMOS sensors or any other built on a substrate, typically a semiconductor substrate) but also several layers of optical materials located on the sensor substrate, which optically process light rays before arrival to the sensors.

The main novelty of this patent is the use of optical layers of different refractive indices positioned on one another, including plenoptic microlenses, the bottom of said layers on a photo-sensors substrate (CCD, CMOS or other photo-sensors technology past, present or future).

Referring to FIG. 14, which shows an implementation of one of the inventions, we can distinguish, from bottom to top, a substrate 1 on which the photo-sensors 2 are located (the substrate may for example be a semiconductor substrate, the photo-sensors may be for example photodiodes, phototransistors or other photo-sensors, semiconductor technology used may be a CMOS technology or any past, present or future technology to manufacture photo-sensors and/or electronic circuit); the figure shows only one dimension, but the sensors are constructed in two dimensions, forming a "two-dimensional array". On the "array of photo-sensors" color filters (6, 7 and 8) can be placed if desired to build a color image sensor (compared to one in white, black and shades of gray), color filters usually contain the three primary colors (green 6, red 7 and blue 8; or yellow, magenta and cyan if other set of primary colors is used), the array of colors has evolved from a structure like that of FIG. 10.A to a structure as that of FIGS. 10.B and 10.C; in the most modern manufacturing processes, on the color filters usually a micro-lens is placed for each photo-sensor/filter, the aim of these micro-lens is to focus the beam of light into the interior (on the active area of photosensor), since the sum of all areas of all sensors 2 is less than the area of the substrate 1 due to the need to use the space for biasing and reading circuits; on the microlenses an optical layer 3 of low refractive index 4 is placed so that the light beams are refracted toward the photo-sensors concentrating all the light energy per unit area through the area 4 in the area of the photo-sensors 2; in order to have this condition met the refractive index material 4 must have a value less than the refractive index of the material 3; finally, the microlenses 5 (with a material of high refractive index, greater than the material 4) are placed.

The structure formed by the materials 5, 4 and 3, properly designing the profiles of the lenses 5 and 3 and the distance x a similar plenoptic structure described in FIGS. 2, 3, 4, 6., 6.B, 8.A and 8.B is obtained (in the implementation of FIG. 14, under each plenoptic microlensing 5 there are 4 pixels, actually they are 16 pixels in the two-dimensional structure assuming the plenoptic lenses 5 have a square shape (4×4 pixels), although as we will see later it is possible to design the geometry of the pixels and microlenses following different patterns than the traditional); the structure described in several ways is better under the optical point of view as mentioned above: against micro-lens structures near image sensors, similar to FIGS. 3, 4, 6.A and 6.B, the mechanical complexity and manufacturing costs are reduced drastically, it also becomes possible to use a plenoptic sensor as recited with traditional or near-traditional targets for professional cameras with high quality optics and a very high number of pixels (designing a sensor of this type for a large camera to produce a large number of pixels in an area of a few square centimeters with an area of each micro-lens of relatively high values, compared with the difficulty of designing a camera to a mobile telephone or a laptop, where the number of megapixels desired and the number of microlenses desired must be designed in very small sizes (less than 1 cm×1 cm), so that such sensors offer better characteristics than the solutions FIGS. 5.A, 5.B, 7A and 7.C, plus the facility to control the tolerances of the microlenses in a microelectronic process (photolithography or otherwise) against a discrete manufacturing carried out in the FIGS. 5.A, 6.A, 6.B, 7.A and 7.C. The mechanical and manufacturing complexity is also lower than achievable in FIGS. 8.A and 8.B avoiding alignment processes between different wafers and air gaps (or other gas) as those between the microlenses and the sensors of said figures, structures inherently less monolithic as described herein in the present invention and that are more amenable to the presence of contaminating materials between the sensor and the microlenses.

Returning to FIG. 14, the manufacturing processes of microelectronic not only allow extremely high precisions for designing the microlenses 3 and 5 of FIG. 14 (spherical, aspherical, convex, concave or following any desired pattern by designer) but perfectly possible to control other design parameters such as distance x, depending on the distance algorithm is usually equal to the focal length of the plenoptic lenses 5 or less/more for other types of algorithms. For example, in FIG. 15 this distance is reduced compared to FIG. 14 (enabling higher discrimination algorithms in terms of number of pixels, but lower discrimination regarding directionality of the incident rays in the sensor).

Instead of plenoptic microlenses 5 (which we named to contrast the pixel microlenses 3) of a bi-convex form, sometimes lenses with convex plane (5) are used, as shown in FIG. 16 (where it is shown an implementation in which two layers with low refractive index are used (labeled in Figure "Refractive Index 2" and "Refractive Index 3") between the microlenses 3 and 5 (built with materials of high index refraction: labeled in Figure "Refractive Index 1" and "Refractive Index 4"), with the sole aim of providing more flexibility to the manufacturing process and the interfaces between different refractive indices).

The flexibilities offered by manufacturing methods for optics similar to those offered by microelectronics are endless, for example FIG. 17 shows a structure with only the pixel microlenses thereon and the plenoptics microlenses in said Figure both the first and the second are spherical while in FIG. 18 have an aspheric structure. The distance between the diameter of the "plenoptic hemispheres" and the diameter of the "pixel hemispheres" in the figure is equal to zero (both hemispheres rest on the substrate), but the plenoptic hemispheres would be placed at a greater distance from the substrate, creating structures similar to those of FIG. 8.C.

FIGS. 19 to 22 show a possible manufacturing flow that enables wafer-level processing, providing the ability to manufacture a large number of sensors of very high quality at very low prices.

It is not shown in the figures the substrate containing the array of photo-sensors or the manufacture of color filters and their associated pixel micro-lenses, since these structures have been very widely known in existing products, and thus in the foregoing it will be discussed the detailed description of the structures of the invention.

From FIG. 19, the photo-sensor substrate (pixel lenses with high refractive index (labeled in the figure as "refractive index 1") to focus the beam of rays on the working area of the photo-sensor) above them a photo-resistive transparent low refractive index (Refractive Index 2) materials are placed, as shown in FIG. 19 (the refractive indices of the pixel microlenses, usually based on transparent resins can have values around 1.5, while there are other materials and meta-materials that can have values around 1.1 or even lower. The distance x can be made larger or smaller depending on the number of coatings. On the structure of FIG. 19 is performed a selective lighting to follow by etching with a selective attack (dependent upon previously selected lighting), resulting in the structure of FIG. 20, remember that the "Refractive Index 2" material deposited in FIG. 19 can be attacked in a selective manner in a photo-lithographic process.

On the structure of FIG. 20 transparent-resistive photoresist high refractive index is repositioned (labeled "Refractive Index 3 or Refractive Index 1" in FIG. 21), resulting in the structure of FIG. 21. This material with high refractive index may be similar or even the same material with which were built the pixel microlenses (Refractive Index-1); the next step is a new photolithography process and selective lighting and etching, ultimately resulting in the structure of FIG. 22, said structure is a monolithic version (built on a single chip) of the traditional plenoptic structure disclosed in FIGS. 2, 3, 4, 6.A, 6.B, 8. and 8.B; and as such susceptible to apply the same algorithms of recognition of arrival direction of the ray, refocusing, distances from the camera to the real point, etc.

Being able to use methods typically used in microelectronics manufacturing, leading to micro-optical structures formed by elements with different refractive indices and easy to control tolerances with advanced manufacturing processes used in microelectronics, the invention gives great flexibility to adapt to different design compromises in terms of manufacturing processes or different quality-value relationships.

For example, the manufacturing processes using CCD or CMOS very mature, and therefore with infrastructure of manufacturing already paid and likely susceptible to offer very low cost for applications where the sophistication and quality are not primordial, may lead to structures like described in FIG. 23: as they are mature processes, where the size of bias circuits, reading and writing are relatively high compared to the overall dimensions, the photo-sensors 2 occupy a percentage of the total area of the relatively low substrate 1 with respect to the total area (as compared to for example FIG. 14, where we can appreciate a more advance microelectronic process, in which the dimensions of the electronic circuits have been reduced, occupying a relatively lower area to the total area of the substrate). This structure, described in FIG. 23, will require a greater distance between the surface of the substrate (e.g. silicon CMOS processes) and the surface of the microlenses (with a distance between the pixel microlenses and the plenoptic microlenses (x1) which can be equal or different from FIG. 14), since the incident light beam should be focused on a smaller area, and that is the reason why the material 3 has increased thickness in the FIG. 23, which can be relatively easily processed through optical materials similar to microelectronic materials, such as the deposition of thicker transparent materials followed by a photo-lithography (illuminated and etched) to create surfaces of the microlenses with very high precision for both spherical and aspheric microlenses.

FIG. 24 shows how a micro-lens on a square area of a photo-sensor substrate is built (the square of the line with smaller thickness is the area of the photo-sensor), high precision of the photolithographic processes enable designs and manufacturing spherical lenses square bases rather than hemispherical lens with circular bases. Such manufacturing processes allow structures in which the lens on the photo-sensor, instead of placing a single hemisphere, places 4 parts of the hemisphere intersecting each other in 4 lines. The FIG. 25.A shows two pixels built next to each other, the thin square line is the photo-sensor constructed on the substrate (such as a CMOS substrate) between said photo-sensors and the squares of thick line appears the area of the substrate area reserved for bias electronics and reading, the blades (as X) placed in the upper part represent the intersections between the four hemispherical portions constituting each micro-lens associated with each pixel.

FIG. 25.B shows a top view of an array of 4 by 4 pixels, FIG. 26 shows a transverse view of the structure, also showing the plenoptic lens 5, located at a distance x2 of the pixel lens 3 with a transparent material of low refractive index lens 4 between plenoptic lens 5 and pixel lens 3. In this example, each micro-lens 5 of the array plenoptic microlens contains 16 pixels (4 by 4). We can also see that the process of microelectronic fabrication has evolved into denser structures (more sub-micron), increasing the percentage of area used for the photo-sensors 2 to the total area of the substrate 1. The vertical size of the pixel microlenses has also reduced when increasing the percentage of area 2 (since the light beam incident on the pixel micro-lens 3 does not need as much vertical distance to concentrate on the area of the photo-sensor 2. Optional filters of the three fundamental colors (8, 6 and 7) remain in place in case of a sensor in color.

The different optical layers can be formed by processes well known in the prior art such as CVD (Chemical Vapor Deposition), LPCVD (Low Pressure Chemical Vapor Deposition), PECVD (Plasma Enhanced Chemical Vapor Deposition), HIDPCVD (High Density Plasma Chemical Vapor Deposition) or other deposition processes of materials commonly used in microelectronics, as can be simple deposition by gravitational force of a molten material, methods used in this case to conduct depositions of optical materials.

We discuss below the optical materials used or usable for carrying out the inventions, emphasizing that these are just examples that by no means are intended to restrict the generality of the inventions, since it is possible to implement such inventions with the materials cited in the examples, or with alternative materials, including new materials non-existent today.

The plenoptic lens 5, as well as pixel lenses 3 can be made of photosensitive materials of glass, allowing fabrication at wafer level, with a large number of image sensors per wafer and minimal human intervention, lowering costs production. The lenses (plenoptic and pixel) can also be manufactured at wafer level with thermo-plastic, photo-resistive material or transparent polymers of high refractive index that after etching they can be subjected to a curing process (such as with UV light—ultraviolet—or heat curing at a high temperature). UV curing can be carried out selectively to then remove uncured portions using a suitable solvent. Is it also possible to use several commercial implementations of hybrid organic-inorganic polymers and/or tails of high refractive index curable by UV light. Solid polymers can be used which can attack on uncured areas or liquid polymers that under certain conditions (temperature or UV illumination) become transparent solids with several refractive indices, thereby resulting in optical structures.

It has been mentioned that several materials typically used for the microlenses 3 and 5, typically have refractive indices greater than 1.5, reaching 2 for some materials, a suitable lens material of high refractive index is silicon nitride (with refractive index 2.0), which can be deposited by a plasma CVD process (Chemical Vapor Deposition of plasma), another alternative is to form a polyimide resin film (with a refractive index of 1.6 to 1.7) by depositing on the substrate and subsequent centrifugation (spinning), then giving the right shape to create the lens with suitable solvents to the type of material used, for example silicon nitride is attackable by dry-etching (or dry chemical attack). Fluid materials can be deposited giving rise to softer materials which subsequently require a curing process (thermal or UV-Ultraviolet-) to harden, or cast deposit acquiring hardness during solidification materials; processes applicable to different types of glass, plastics, organic-inorganic polymers and other materials mentioned.

The possibilities offered by the microelectronic manufacturing processes give the designer the flexibility to build lenses with different materials with different Abbe number, different dispersion characteristics, with variable diameter (pitch), or with different refractive indices, lens circular (or hemispherical/semispherical if we see in 3 dimensions), square (overlapping four domes/aspherical intersecting each other if we see in three dimensions), hexagonal (six overlapping spherical/aspherical caps seen in 3 dimensions), including triangular, the same is true of the design of the pixels, opening the possibility for the design of novel topologies that are provided at better efficiencies of the plenoptic algorithms and offer better lighting performance (such as hexagonal microlenses covering 6 triangular pixels) also expanding the flexibility to offer very flexible designs for achromatic lenses. You can deposit layers of different thicknesses, new layers of different characteristics deposited on previous lenses, ultimately, the design flexibility is much greater than in large discrete optics. Additionally, layers can be created with refractive index close 1 (including air) due to the use of "sacrificial material": on a transparent layer (of material 3, 4 or 5) resistive photo thickness material is deposited and required form on this a new transparent layer (of material 3, 4 or 5) is created with several openings to allow the entry of a suitable solvent to the buried photo-resistive material, which can be subsequently dissolved and removed later. Despite the flexibility offered to the designer to achieve refractive indices close to 1, even air layers between materials of high refractive index, said design must necessarily include "support columns between the two layers of transparent material (3 and 5), as for example shown in FIG. 14.b, with all the drawbacks that this entails (presence of "columns" of high refractive index 4' between the two layers 3 and 5; or a structure with possible mechanical problems due to the low abundance of said columns of mechanical support between layers of higher index of refraction). More attractive is the use of meta-materials (instead of air or gases), providing refractive indices which may be even lower than 1. The expendable material may be water-soluble gels, and several commercially available materials or conventional photo-resistive of very widely commercialized integrated circuits (soluble in water, acetone or iso-propanol).

The material 4 can be any transparent material of low refractive index. In order to reduce the distance between the plenoptic lenses and the pixel lenses (x in FIG. 14) as well as the size of the pixel lenses, the ratios between the refractive indices of the materials 5 and 4 (as well as also 3 and 4) should be as high as possible. The possibilities for the transparent layers 4 of low refractive index are glass, plastics, inorganic copolymers or organic polymers, with refractive indices of about 1.5.

A well-known method to reduce the refractive index of an organic polymer is to provide a composition with higher fluorine content, however this fact gives the material lower solubility to water and oils and makes it difficult to have tight junctions in interfaces between materials with high and low refractive index, a possible solution to this problem is to bathe the transparent surface of high refractive index on which it will place the material low refractive index (or low surface refractive index of which is to place the material with high refractive index) to a plasma treatment in oxygen rich (in an atmosphere with high oxygen content); however, if this process is not carried out in a very controlled manner, it can lead to problems of adhesiveness, deteriorating the quality and manufacturing efficiency. That is why the fluoro-organic compounds or fluoro-inorganic are commonly used only in the first layers immediately above the sensors, despite their low refractive index (1.3 or 1.4 for acrylic films fluororesins, usually formed by centrifuging—spin coating—or magnesium fluoride films typically deposited by sputtering), forming "sandwiches" with layers of various refractive indices (although simplified in the figures where only a single layer has been placed) based not only on the design criteria of the refractive index but also in adhesiveness criteria between layers.

Other transparent materials used immediately upon the photo-sensors can be (in a single layer or multilayer structures, which may include a passivation layer and/or planarization) those which traditionally have been used in the dielectric between the metal layers and/or polysilicon normally used to establish interconnections between active elements of the chips, materials such as silicon oxide, FSG (Fluorinated Silicate Glass or glass Fluoro Silicate) oxide doped carbon, MSQ (Methyl-Silsesqui-Oxane), HSQ (Hydrogen SilseQuioxano) FTEOS (Fluoro Tetra Ethyl Ortho Silicate) or BPSG (Boro-Phospho Silicate glass or phospho-silicate glass Boron), the latter usually formed by a thermal reflow process (reflux) around 900 degrees Celsius, the above formed by CVD, LPCVD, PECVD, HIPCVD, or other well known in the prior art deposition methods. The passivation or planarization layer (not exposed in the figures for simplicity and being well known in the art) may be formed of various compounds, such as silicon nitride (SiN or Si3N4), silicon oxynitride (SiON), Silicon carbide (SiC), silicon Oxi carbide (SiOC) or other combinations with similar properties. Color filters generally protect them by placing additional clearcoats of silicon oxide or combinations thereof, not drawn in the figures for the sake of simplicity, it can be deposited by CVD, LPCVD, PECVD, HDPCVD or other deposition processes well known in the art.

Then it is explained a manufacturing process proposed for the invention in order to obtain similar structures to that discussed in FIG. 14, with reference to manufacturing process sequence set forth in FIGS. 19, 20, 21 and 22. We start with a substrate photo-sensors 1, with its array of photo-sensors 2, its color filters (6, 7 and 8) and pixel lens 3 well known in the art and widely used in CMOS processes structure, although the invention could be applied to various structures. On said structure (FIG. 19) offering a high refractive index for pixel lenses (Refractive Index 1) a material of low refractive index (refractive index 2) is positioned with a thickness x decided in the design process. This layer may be a single or a "sandwich layers" such as that shown in FIG. 16, which for example has been added a first layer of low refractive index (refractive index 2) by processes such as XCVD, deposition-centrifugation or other well known processes in the prior art, and on that layer there has been bonded a substrate also of a low refractive index (refractive index 3 in FIG. 16).

On the structure of FIG. 19 there is, for example, a photosensitive layer with a material as a positive photo-resistor, which layer is positioned on the "Refractive Index 2" layer. Said photosensitive layer is exposed selectively to light using a gray mask, for example illuminating with lamps I-line (lamps with mercury vapor at very high pressure), so the structure is exposed to different light intensities, with which upon exposure to light and subsequent etching the layer of photo-resistive material provides exactly the same curvature of the top of FIG. 20. After etching the photo-resistive material layer is attacked for example chemical attack with in dry etching solvents (dry etching), which typically involves the bombardment of the layer with ions (typically a plasma of reactive gases such as fluorine-carbonates, oxygen, chlorine, boron trichloride and occasionally adding hydrogen, argon, helium and other gases). This attack, in addition to "cleaning" the photosensitive material begins to "clean" (empty) the material of the lower layer, transferring to the low refractive index layer 4 ("Index of Refraction 2" in FIG. 19) the same curve that was initially formed in the photo-resistive material. The accuracy and reproducibility using dry etching are excellent. Liquid solvents could also be used, but they attack in a more anisotropic way. In FIG. 20 we have obtained a concave structure, but as we shall see later convex structures could have obtained.

Finally a third layer of material with high refractive index is created ("Refractive Index 3 or refractive index 1" in FIG. 21), which can be deposited with techniques similar to those explained above, such as CVD, LPCVD, PECVD, HDP-CVD or other deposition processes well known in the art. If this layer "Refractive Index 3 or refractive index 1" has been deposited with a photosensitive transparent material (resin, glass or other photo-sensitive materials) it suffice subjecting said structure to a light exposure similar to that described above to thereafter subjecting said layer to attack which selectively dissolves the material, resulting in the final structure of FIG. 22 (one plenoptic structure obtained using manufacturing processes typically used in microelectronics). Another alternative is to repeat the process previously used to place on the structure of FIG. 21 a layer of photo-resistive material, subjecting it to selective illumination with, for example, a mask of gray levels, and subjecting the resulting structure to the final attack with for example dry-etching (attack with dry solvents) to not only clean the structure of the photo-resistive material, but lead to layer 5 of high refractive index profile initially created in the photo-resistive material.

It has been described the invention with an example of a determined photo-lithography, but other known or future photolithographic techniques can also be used when implementing the inventions, such as EUV (Extreme Ultra Violet) of which can be expected definitions reaching 13.5 nanometers.

The superior optical layers of FIGS. 14, 15, 16, 17 and 18 may also be constructed by replication techniques, that is, it is deposited in a mold with the negative of the shape of the lenses a polymer (which may be viscous or liquid at room temperature), on said mold the wafer sensors is placed in inverted form, so that this has physical contact with the polymer-liquid or viscous (on the side of the photo-sensors and I pixel lenses), then to solidify the polymer by exposure to ultraviolet light or by high temperatures. The polymer will result in a transparent solid with suitable refractive index, thus forming the matrix of plenoptic microlenses.

Color filters are created by depositing layers of each of the three colors by consecutive photolithographic processes, to then cover all with a protective layer or passivation.

There is the possibility of placing in the top of the plenoptic microlenses, the pixel microlenses and in elsewhere, layers of anti-glare coating, thus helping to improve the luminous efficiency of the structures, as well as IR (infra-red) filters, in order to improve the signal/noise ratio in the photo-sensors by filtering the unwanted portion of the spectrum.

Pixel lenses are made similar to those described for the methods plenoptic lenses.

The processes briefly described, together with other techniques and instruments of the optical and microelectronics, such as mechanical stamping glass (cold and high temperature), the heat-refluxing, the molding tools with ultra-precision, laser marking and other processes well known in the state of the art optics and microelectronics, lead to processes, tools and results extremely sophisticated, accurate and cost effective, providing the designer possibilities of axial tolerance set by the tolerances of the thickness of the layers. The tolerances of the side mounting are determined by the accuracy of the photolithographic masks (able to play at very loud volumes, hundreds of millions of units, patterns as small as 28 nm and lower in the near future), leading to integrated products monolithically with extremely simple manufacturing technology that will make miniature products compete and overcome some of its features in products optics with great size and weight. As an example it can be said that with tolerances of the order of nanometers in the physical implementation of micro-lenses, aberrations can be much lower than in large chambers.

The optical wafers and optical sensor wafers can be manufactured separately and subsequently put them together (by welding, anodic bonding processes or link) by "alignment marks" in both wafers and providing great precision using modern mask aligners; or the optical layers with different patterns on the wafer sensor can be created by deposition techniques, epitaxial growth or other techniques well known in the art.

As in microelectronics for the fabrication of integrated circuits, or in any manufacturing process of image sensor (CMOS, CCD, or otherwise) the last steps consist in cutting (dicing) the wafer into several individual chips and later encapsulating, usually with a plastic or ceramic package (which includes an opening with a transparent material on top to let light through to the sensor), and metal pins for electrical interconnection of the chip with the outside system, or in the case of chips with very high density of pins, instead of metal pins an array of solder balls can be used which are located on the bottom of the chip (BGA or ball grid array) similar to the solder balls in the bottom of FIG. 13; even at the cost of more expensive unit costs, depending on the manufacturing processes and the availability of certain instruments, it would be possible to perform cutting (dicing) the optical wafer and the electronic wafer separately, and place each device on each optical sensor above the encapsulation process.

There are several practical problems by the miniaturization that the disclosed inventions solved in a more appropriate way than other technologies. The outer lens leading incident light to a sensor as proposed, or any sensor generally seeing reduced thickness of the sensor (with a total thickness less than 1 cm, or even less to, for example, form part of a mobile phone) receiving the bundles of light rays in a less perpendicular manner on the plenoptic microlenses of the periphery array than on the microlenses of the center of the array, so that light is not directed efficiently toward the photo-sensors, giving a maximum efficiency in the center of the photo-sensor and deteriorating gradually towards its periphery. Light incident on the plenoptic microlenses the periphery of the array is steeper than in the center of the array, resulting in a shallower focal length seen from the pixels in the periphery of the photo-sensor from the pixels in the center the photo-sensor. There are three ways to solve this problem, the first is to space the photo-sensor pixel differently in the periphery than in the center (placing the "disks" or "square" or "hex" or "any shape" designed for corresponding to the plenoptic microlenses the periphery of the "square or hexagonal discs or" array farther from their adjacent in the central zone), while increasing the area of the pixels in the periphery of the sensor from the pixel in the center of the sensor. This solution is not efficient because it increases the area of the substrate (e.g. silicon in a CMOS process) and increases the cost of the product, but we have seen fit to mention it.

The second solution to the problem described in the previous paragraph is a design of the plenoptic microlenses with different profiles at the center than at the periphery of plenoptic array, in order to ensure greater perpendicular deviations to do less in the periphery than in the center of the plenoptic array; with this measure only the center of the lens array would be perfectly symmetrical about its axis, and gradually as it moves towards the periphery of the plenoptic array, the microlenses are increasingly asymmetrical with respect to its axis to ensure the perpendicularity of the beams in the photo-sensor is exactly equally efficient in its central region as in its periphery. This solution, a virtually nonviable in discrete optical implementation is extremely efficient and easy to implement using photolithographic processes for the manufacture of micro-lenses as those set forth in inventions.

A third solution is to gradually vary the distance between microlenses and the sensor (parameter x in FIG. 14) so that said distance is smaller at the periphery of plenoptic array than at its center. Only a single micro-lens (or two or four at most) is (are) perpendicular to the optical axis of the system, the micro-lens in the center of the sensor, since x is variable in other micro-lenses increasingly inclined against the optical axis and ever closer to the plane of sensors as we move away from the center of plenoptic array. This solution also virtually nonviable in discrete optics, is efficient and easily implemented using photolithographic processes.

A mixed solution among those discussed in the preceding paragraphs is the most efficient from the point of view of maximizing optical efficiency and minimizing optical aberrations, already very low efficiency due to distance control and the shape of the lenses thanks to the use of photolithographic processes.

Depending on the processes and materials available there are produced as well the structures as the one from FIG. 14.*b*, where the material layer 4 (with low refractive index) has been replaced by air (or other inert gaseous materials, non-corrosive and are produced with good properties against moisture penetrations); the distance between the photo-sensors 2 (or its associated lens 3) and the "microlens array" 5 is maintained thanks to the spacers 4'. This structure is also relatively simple and with low cost manufacturing techniques using "wafer stacking": on a wafer of usual photo-sensors in the state of the art of sensors (containing the substrate 1, the photo-sensors 2, color filters 6, 7 and 8, and optionally the microlenses 3) a second wafer with spacers (4') is placed and on this a third wafer is placed with the microlenses 5. The mask alignment techniques for manufacturing process and wafer alignment in microelectronic manufacturing processes lead to excellent results with the optical wafer and aligning the electronic wafer with optics. Usually standard wafers of 8 or 12 inches are used.

The material of the spacer wafer 4' should absorb light, avoiding any kind of reflection that would lead to "double images"; this objective can be accomplished in a simple way such as the coating of the side walls of the separator 4' with anti-reflective material, for example by sprays. Wafer separator 4' may be attached to the sensor wafer by welding, anodic bond, by temperature or by adhesive resins which can be cured by ultraviolet light or hardening temperature; deposition of these resins must be symmetrical to the optical axis, avoiding areas of the optical path of the light to the sensor in a selective manner by printing techniques or spray. Similarly microlenses wafer 5 is fixed to the separator 4'.

The spacer wafer 4' is made physically or chemically attacking (etching) a glass substrate of the same dimensions as the sensors wafer (usually 8 or 12 inches), the openings also may be performed by laser cutting, powder jets pressure or ultrasonic drilling.

The material 4' and 5 may be constructed in another option as one piece rather than as two separate pieces. Thus the wafer 5+4' is placed on the photo-sensing wafer (1+2+6+7+8+3).

Alternative to the manufacture of the optical wafer spacers (4'), these can be constructed by depositing a dry photo-resistive material on the semiconductor substrate (and with color filters and pixel lenses) and subsequent chemical attack or physical (etching) to open the separating gaps which will align the pixel lenses (3) with the plenoptic microlenses.

There are many methods to manufacture microlens wafer 5. Although in FIG. 14.*b* only the final product can be seen, this may be obtained thanks to using a thin substrate having convex-flat microlenses formed on its top portion and flat convex on its bottom portion. The microlenses can be manufactured with organic materials of glass, epoxy, or silicone or acrylic materials. The microlenses may also be formed by replication processes where polymers or curable liquids are used (by UV light or heat), the microlenses can be built on a thin transparent substrate of glass, plastic, quartz or resin. This way spherical, aspherical lenses or otherwise can be built. It can also be constructed by techniques of photolithography attack of materials sensitive to chemical or physical attacks, or depositing photo-resistive materials on the substrate of microlenses, etching them to give them the shape of the lenses by using a mask of gray, to then subject the structure to a physical or chemical attack (etching) in order to take the shape of photo-resistive material which subsequently form the lens materials; performing the process on one side of the microlenses wafer or both sides.

After the alignment and fastening of the microlenses wafer 5 to the separators wafer 4' it can proceed to cutting (dicing), or separation of each of the plenoptic sensors contained in the wafer.

The microlenses 5 on top of the structure may be covered with layers to filter IR (infra-red) light, thereby increasing the signal/noise ratio sensors. The use of anti-reflective coatings prevents so that part of the incident light output does not reach the sensor.

The plenoptic algorithms used by the technology described in FIG. 14.*b* place the plane sensors at a distance less than the focal length of the input optical system.

The biggest impact from the disclosed inventions leads to the use of meta-materials as part of the micro-optical processes described; thanks to the use of materials with no negative refractive index but only of materials with positive refractive index of less than 1, can drastically reduce the dimensions of the optics. Referring to FIG. 14, if the refractive index of the layer 4 is made for example 0.5 or 0.1 the distance x would be drastically reduced, making feasible a monolithic integration with unprecedented thicknesses (particularly suitable for fields such as mobile phone, claiming sensors with very small dimensions). Monolithic sensors were manufactured (by integrating electronic and optics) in which the distance between the pixel microlenses 3 and the surface microlenses 5 is of three millimeters, on further increase the size of the integrated sensor to reach the size that would be achieved with discrete optical of small size (as in FIG. 11) and can result in wafers with an excessive thickness, great difficulties in the cutting process (dicing) and mechanical instabilities, deteriorating the yield of the manufacturing process, increasing costs and the size of the monolithic structure.

However, the use of meta-materials with lower refractive index than 1 not only reduces the distance x between the pixel microlenses and the plenoptic microlenses (FIG. 22.B) but allow to be brought into a micro thickness acceptable to the manufacturing processes described in the invention (a few millimeters) and a higher number of lenses as part of a single monolithic sensor. Referring to FIG. 22.B, the use of a meta-material 4 a refractive index of less than 1 decreases the distance x, and enables the deposition of a second layer of meta-material 4' on the plenoptic microlenses, on which for example it can be constructed concave/convex lenses 5', or bi-concave lenses 5", or concave/convex lenses 5' or bi-convex lenses 5"", or a combination of several lenses with a "sandwich" structure similar to that depicted in FIG. 22.B, resulting in a monolithic sensor that integrates all lenses of a micro-camera, which thanks to the use of photolithographic techniques described in the invention, rivals in some features, such as optical aberrations and lighting efficiency, with their large counterparts, these cameras beating production facility for very high volumes at low cost.

The order in which the different lenses are deposited may be any suitable for the designer, so the structure of FIG. 22.B is a micro-optical structure equivalent of FIG. 6.B (except to the zoom, which can also be constructed micro-optically, as discussed below); if the layer 5 (FIG. 22.B) is at the top of the "optical-sandwich" integrated structures equivalent to those of FIGS. 5.A and 5.B are reached; or if the second is placed (immediately below the input lens separating the micro-camera of object space) micro-optical lenses equivalents is reached FIGS. 7.A and 7.C.

Without reaching the extreme size reduction reported in FIG. 22.B thanks to the use of materials monolithically integrated chambers with refractive indices of less than 1, are obtained as described in FIG. 22.C (where gaps between layers are not drawn to the same scale as in 22.B). Materials of low refractive index (4) of FIG. 22.B were replace with air (or other gas), and the spacing between the high refractive index lenses (5), including microlenses, are guaranteed thanks to the use of spacing wafers 4"" so that on the sensors wafer (including layers 1, 2, 6, 7, 8 and optionally 3) it is located a first spacing wafer 4"", on which is placed a plenoptic microlenses wafer 5, on this a second spacing wafer which is placed supports for placement of a first lens (convex-concave in this example), and so on, building a micro-camera of excellent performance suitable for use in portable devices (mobile phones, laptops, tablets, etc., etc.). This invention is a super-set of the depicted in FIG. 14.*b*, through the addition of more lenses by stacking optical wafers on the sensor wafer and the first plenoptic lens wafer.

Manufacturing techniques have already been exposed to describe FIG. 14.b, we explained below various possibilities for the manufacture of lens wafers in the upper layers of FIG. 22.C, some widely described by Wolterink, Dohmen Sander Van Der Sijde, Arjen De Bruin, Groot and Anton Van Arendonk in WO 2004/027880 A2. With the materials described when explaining the FIG. 14.b it can be formed on a thin transparent substrate concave optical elements by replication techniques, thus giving rise to plano-convex lenses (spherical, aspherical or anamorphic). Using replication techniques it is possible to build lenses on a substrate of non-transparent material in which openings have been conducted (gaps to let light pass through) of the sensor dimensions (in a similar manner as would a slice of a Swiss cheese with holes in their lenses, but obviously with holes for the passage of light designed in a more regular basis), the non-transparent substrate prevents the "noise-lighting" reaches the sensor; for example convex-concave lenses may be replicatated in recesses of the substrate, thereby reducing the thickness of the resulting micro-objective. Another less efficient way to build convex-concave lenses is replicated on top of the transparent substrate a fine convex surface, with a corresponding concavity in the bottom replicated substrate. Optical wafer may be constructed as described with any profile, not just those shown in FIG. 22.C but any anamorphic lens. Stacking wafers as described above, or any other easily extrapolated by experts in optics, thus this way it can be produced almost any type of monolithically integrated mini-camera.

Besides the techniques described above, wafers with glass or transparent photosensitive materials with high refractive indices which can be attacked by photolithographic techniques well known in the prior art, leading to any type of lenses with any profile are manufactured in both sides of the lens, with enviable aberrations compared to manufacturing methods lens of great size as compared to the small size tolerances achievable using photolithographic techniques. Another possibility is to deposit a photo-resistive materials on optical wafer, then subjecting the material to gray masks, etching in order to create the desired optical profile of the lens on the photo-resistive material to then proceed with a physical or chemical attack (etching) not only remove the photo-resistive material, but reproduce the profile of the surface obtained photolithographically on the optical substrate. This technique results in lenses without possible compared in size or in aberrations with the state of the prior art.

The order in which the wafers are stacked and built the optical layers of sensor (or micro-chamber) is not necessarily that illustrated in FIGS. 22.B and 22.C, for example, microlenses wafer could be last instead of the first (counting from the surface of pixel lenses), resulting in a monolithic implementation similar to the discrete implementation (with individual lenses) in FIG. 5. A; in another example wafer microlenses could be between the input lens and other lenses (located between the LMA and the sensor), resulting in a monolithic implementation of the structure in FIGS. 7.A, 7.B and 7.C.

Mixed solutions in the figures between 22.B and 22.C are also possible, where the sensor closest to the lens are constructed by depositing alternate low and high refractive index layers, while the more remote layers of the sensor are constructed by spacers and stacking wafers. The microlenses can be part of the first structure (obtained by growth of layers in the sensor) or the second structure (obtained by stacking wafers). Any permutation, in the order of layers as in the manufacturing technique is possible.

A completely different field of innovation in this invention is in the number of integrated megapixel (both large cameras and mini-cameras for mobile phones, tablets and handheld devices), theoretically continuing Moore's Law applied in microelectronics, but in practice limited by light inefficiency of very small pixels, the size of the pixels can not decrease indefinitely, because for very small dimensions the wave nature of light begins to manifest, the light beams objectives, micro plenoptic-lenses and the microlenses pixel takes on the pixels (photo-sensor) have a density of planar light output independent of the distances on the sensor surface, the power density has a form like that of FIG. 27.A (assuming circular lenses in the light path), with a central region where most of the energy is concentrated (center pixel, called the Airy circle, dark gray at the bottom of FIG. 27.A), and side lobes increasingly smaller as we move away from the center pixel (Airy rings, concentric rings in gray more clear in the bottom of FIG. 27.A). It is well known that in an optical system whose exit pupil is circular, the irradiance distribution associated with the image of a point object is constituted by a central circular lobe in which most of the energy is concentrated (84%), and a series of concentric rings of decreasing intensity.

In one implementation described as pixel lenses are not perfect hemispheres (or semi-spheres), but four hemispherical (or semi-aspherical) sectors intersecting each other to focus the light beam onto a photo-sensor square (see FIG. 24), circles and Airy rings are not perfect circles but four circular sectors composing what we call a 'cuadri-circle" as seen in the top of FIG. 27. B (compared with a circle of Airy usual in the bottom of the figure). But such peculiarity does not diminish generality the inventions described below. If the pixel lenses were hexagonal it would lead to a power distribution in a "hexa-circle".

If the pixel size (micro-lens and/or photo sensor) becomes so small as the main lobe of light energy (Airy circle of FIG. 27. or 27.B), the secondary output queues (Airy rings FIG. 27.A, or "quadri-rings" in FIG. 27. B) may eventually fall into adjacent pixels instead of on the correct photo-sensor, leading to interference between pixels. Before coming to the phenomenon of interference between points, depending among other things on the ratio between refractive indices, it is possible that the microlenses (hemispheres, or rather "quadri-spheres", consisting of four spherical sectors or aspherical, or "hexa-spheres" in case of hexagonal microlenses, or trian-spheres or other geometric shape) between adjacent pixels come to overlap, as seen in FIG. 28, which illustrates such a deep sub-micron process, where the area of the photo-sensor is very high compared with the total area of the substrate (photo-sensor and bias circuits and reading). The fact that the two hemispheres (or two aspherical lenses or two quadri-spheres) of two adjacent pixels overlap, has no negative effect, rather it is a positive effect, as if the area of the photosensor is out very small compared to the total area of the substrate, the thickness of the material in the vertical direction of the pixel micro-lens (3) would be very high, increasing the total size of the structure. In this case, the thickness of the pixel micro-lens 3 in the vertical direction is so low, and the space in the vertical direction from the surface of the micro-lens to the pixel photo-sensor is so small that a thickness very low of the structure we take virtually 100% of the light energy received through the main camera lens to the useful surface of the photo-sensors. A difference from some of the structures seen above is that the limits of the upper surface of the microlenses 3, the lower part of their profile does not actually touch the substrate 1, making the lines of intersection between the surface of two adjacent microlenses the low refractive index material 4 always located at a minimum distance of the substrate 1, as illustrated in FIGS. 28 and 29.

When specifying a design of very small dimensions, where the camera would form part of an apparatus of very small dimensions and at the same time we were obliged to have a very large number of pixels, reducing size can reach the extreme end where the size of each of the photo-sensors may be required to reach similar to the width of the main lobe of FIG. 27. In this case we have to accept that there will be some inter-pixel noise, if it is low enough there is no reason to have a noticeable deterioration of the quality of the image, we must also accept that light energy that reaches the photo-sensors will not be 100% of the incident energy.

In fact, approaching such dimensions (close to a few microns, even slightly below the micron) in most cases the richness of image detail can only be appreciated thanks to the zooms held in a support computer to display details of a specific area of the image until the pixels become too visible at the cost of excessive zooms, under such circumstances a small interference between adjacent pixels, showing a slight change of image detail in the real world, It is as important as such details in the real world may have different colors. In this circumstance, if color filters, instead of being designed pixel by pixel, are designing a micro-lens by micro-lens, the interference effect between pixels is much less damaging, adopting structures as that of FIG. 30. Several possibilities, one of them is to place the color filters on the plenoptic lenses (top of FIG. 30), another possibility is to place the filters (as traditionally done) between the lenses and the pixel photo-sensor (bottom of FIG. 30), a third is to use smaller filters thickness combined mixing the two solutions described (filters under the microlenses and pixel on or low plenoptic microlenses). Another possible solution would be for the plenoptic microlenses themselves not only to be constructed of a transparent material with high refractive index, but also filtering properties of colors, as shown in FIG. 31. It is also possible that the pixel microlenses are also filter micro-lenses (as illustrated at the bottom of FIG. 32), or mixed solutions in which filtering is performed in both arrays of microlenses. Such structures are also more efficient under the practical viewpoint, since the dispersion characteristics, refractive index and other optical characteristics of materials used to fabricate the microlenses pixel and the microlenses plenoptic, are not always independent frequency (color), enabling designs in which the pixel microlenses and plenoptic are different and optimized for each color, and allowing the use of less sophisticated optical materials and price.

Structures as described in the preceding paragraphs, or structures where side lobes of FIG. 27 (Airy rings) will fall on areas of the opaque substrate intended for bias circuits and reading, selecting gaps between pixels such as those shown 33.A in FIGS. 34 and 35 are easily obtained thanks to the use of microelectronic fabrication techniques applied to the optical layers as described in the invention. At the end of increasing the number of megapixel sensor and a reduced need for mandatory application, size you can go to the limit to adopt designs as in FIG. 33.B, where the center of a pixel could placed in the valley power of his closest pixels, using the orthogonality between adjacent pixels colors (different frequency) due to the use of different color filters in adjacent pixels, as will be explained in detail below.

Reaching such extreme size reduction, there are other noise effects that become important, as is the light output in the infrared or near infrared spectrum, although not perceptible to the human eye, is a considerable noise in the photo-sensors; how to minimize it, is to add filters for these frequency ranges. Such filters can be placed at any point (or multiple points) of the optical path, by themselves or in combination with color filters (thanks to the use of filters not only a color but very high selectivity for the frequency ranges whose noise is to be avoided), so infrared filters can be placed on the plenoptic microlenses, part of the material of the plenoptic microlenses between the pixel microlenses and the substrate, forming part of the micro-pixel lenses, microlenses on the pixel, in the material of low refractive index located between the pixel microlenses and the plenoptic microlenses (for example in the material 4 in FIG. 29). They can also be constructed by a combination of several of the methods described.

FIG. 34 shows the distribution of light energy on 4 adjacent pixels forming a Bayer pattern (4 pixel square green, red, blue, green) commonly used for color sensors. At the top of Figure irradiance from the microlenses and corresponding pixel color filters is included, in this case we see that the area of the photo-sensor (inner square surrounding the letters V, R, A and V) and the micro-pixel lens are designed so that the main lobe of irradiance reaching the surface of the photo-sensor, and the second and third lobes impinge on an opaque area, thus preventing significant amounts of noise in adjacent photo-sensors. FIG. 35 illustrates the phenomenon more clearly (using the notation of the previous figures) on the substrate 1 there are built photo-sensors 2, and they have been deposited on the green 6 and red 7 filters; however, on the "not active substrate area" (the area not used by the photo-sensors, normally used to bias circuits, A/D converter and reading photo-sensor) has been deposited a layer of opaque material which does not enable the side lobes to reach the substrate, depending on the material technology can also play the role of "metal connection" to the photo-sensors (normally used in CMOS processes), but instead of opaque metal may include other elements normally used or usable in semiconductor manufacturing.

FIG. 36 shows the Yotsuba pattern, another pattern sensors typically used in color (with white pixels arranged in diagonal, and each diagonal of green pixels, and diagonal with alternate pixels: 2 blue and 2 red), the discussions held above they are also applicable to that pattern.

As for example in a CMOS process or other process manufacturing photo-sensors future, present or past, progress towards more sub-micron technologies, bias circuits, reading and connections get smaller, making it possible to design more pixel density in an increasingly smaller space, if at the same time trying to improve the use of the substrate, with areas of photo-sensors increasingly higher percentage compared to the total area of the substrate (for obvious reasons of cost as for example in a CMOS process cost it is proportional to the area of silicon) can reach structures as those in FIG. 37, where the area of the photo-sensor is very high compared to the total area of the substrate, but we have the problem that the second and third lobes illuminate a pixel adjacent photo-sensors, deteriorating the SNR (in terms of inter-pixel noise). Actually the problem is less severe than it first appears because the orthogonality between colors, shown in FIG. 38, showing a design in which the needs of the application specified very small dimensions for the sensor and a number of pixels per unit area very high, so that no one can further reduce dimensions of the microlenses pixel or the photo-sensors, because as these dimensions begin to be comparable to the wavelength of the incident light the beam suffers diffraction and optical structure is not efficient (very few photons reach the photo sensors), and remember that at the time of writing this patent several semiconductor manufacturers have begun manufacturing in volume 28-nanometer CMOS technologies for the dimensions of the gate of a transistor obviously photo-sensors such sizes would be inefficient, because the wavelengths of light would be substantially higher than the dimensions of the photo-sensor, resulting processes reduce diffraction of a way very significant light efficiency.

The urgent need for small size, high packaging and therefore a high number of pixels in a small space, has pushed the set design "photo-sensor/pixel micro-lens" so that the peak irradiance of a set "pixel micro-lens/filter" fall into the first zero irradiance of adjacent pixels (as illustrated in FIGS. 38 and 33.B), resulting for example in a Bayer structure irradiances in red and green on top of the pixels of FIG. 38. However the problem of inter-pixel interference is minimized by the orthogonality of colors, the bottom of FIG. 38 reflects the irradiance from green to red through the filter, an attenuation of 6 dB filtering (solid line) and 10 dB (dotted line) obviously can not indefinitely increase the attenuation of the filters, as these would reach a prohibitive thickness, however it is easy to get to a situation acceptable contrasts for most applications.

More critical is the interference of neighboring points of the same color as the adjacent pixel noise is not filtered. In this respect the Bayer pattern provides better performance, as only the green pixels have green diagonal neighbors, while the YOTSUBA pattern all points are neighbors of the same color diagonally. This phenomenon is illustrated in FIG. 39, in this case the area ratio of the photo-sensor to the total of the substrate is sufficiently low that the two green light beams having their first lobe power in the area of the photo-sensor, and the second and third lobes illuminate the opaque area between photo-sensors. However, as the need for more pixels in less area pushes it, and sub-micron technologies allow, it comes to situations like the one in FIG. 40, which may be good enough for certain applications, but the design criteria have pushed the light beams between "microlens/sensor" adjacent overlapping each other, not only the attenuated overlap between colors (red—shown with large attenuation in the figurative and blue with green) but also two beams of green overlapping between them. Remember that it is not possible to design or area sensors or smaller microlenses, since for these dimensions below a certain threshold wave phenomena start to prevail over the rectilinear propagation, and below these thresholds these structures leave to be efficient, resulting in multiple refractions and diffractions preventing the arrival of an appreciable amount of photon sensors. At this point we must accept certain inefficiencies, which nevertheless will result in enough sensors suitable for a vast majority of applications requiring very small sizes and high density of pixels per unit area, especially if we minimize the problem with inventions described below. First, FIG. 40 shows that not all the main beam irradiance is projected onto sensor area, of the main lobe falls opaque area (a deterioration in the efficiency we must accept the sake of miniaturization), but even more serious is the fact that the second and third lobes of a green pixel introduces noise into other adjacent green pixel, increasing the inter-pixel noise, as shown in FIG. 40, since there is no attenuation filters when being neighbors of the same color. FIG. 40 also shows how the red pixel irradiance (and also blue, which though not exactly be drawn) in green area is greatly attenuated by the filters.

The need for space, the trend towards miniaturization and the increased number of pixels, has pushed structures where the beams illuminating adjacent pixels overlap between them, in that situation wave phenomena, which can be neglected working with more dimensions high, they must be taken into account so that the sensors continue to operate. The irradiance of FIG. 27.A form called Airy circles on the sensors (or quadri-circles in FIG. 27.B in our example lenses of square pixel, or "trian-circles" when using pixels and triangular pixel lenses), given by the expression:

$$E(\rho') = \left| \frac{J_1\left(2\pi \frac{n'\sin\sigma'}{\lambda}\rho'\right)}{\pi \frac{n'\sin\sigma'}{\lambda}\rho'} \right|^2$$

where J 1 is the Bessel function of the first kind and order one, λ the wavelength, the refractive index n, σ the angle of incidence of light rays between the exit pupil and the plane of the photo-sensors and p' the radial coordinate plane image.

The first zero of the function appears on $\rho'_1 = 0.61\lambda/n' \sin \sigma'$, showing that the Airy circle radii depend on the incident wavelength, which establishes the design criteria using different areas of the area photo-sensors for different colors, or different lens design profiles for each color.

In the case of the Bayer pattern, the interference between the two adjacent green pixels in a diagonal direction is less than it would be interference between two adjacent red pixels diagonally with Yotsuba pattern as the wavelength is smaller and hence Airy green circles are smaller than red. Still, if approaching the pixels between them so that we reached the limit of what is prudent and the two beams of green light start to come together, we can take steps (actions) at the design of photo-sensors and FIG. 41 as shown in the right pixel has widened the gap between green pixels to change the physical structure of the photo-sensor (the left side corner of the photo-sensor green right has been deleted—eliminating the active area of substrate—, turning the square into a hexagon symmetrical design if pixels). More efficient the green pixel on the left side of the image, it is taken from the right corner a triangular area on the right side of the photo-sensor green (making it non-active area of the substrate), moving farther the distance between the two photo-sensors adjacent green area of maximum penetration of green light from the micro-lens/filters of the adjacent green sensor, remember that light comes from the top of the structure is diffracted by the micro-lenses carry on the sensor and finally filtered by color filters, which can be part of the same material of the microlenses or be flat color layers located below the microlenses. In either of the two situations described, the irradiance of the highest passes between two adjacent green areas will be passing through the vertex where converge the 3 color sensors (4 pixels adjacent) for two reasons, first place away from the vertex distance is increased and therefore the attenuation (away from the center of the Airy disk), second green light from the green adjacent micro-lens that reaches the apex points away (in areas green-red and blue-green confluence) passes through red and blue filters before reaching the green, fading to an extent that makes it imperceptible in the adjacent green area, and this is the reason why removing the sensor truncate a triangular area of the sensor area, creating a very wide "non-sensitive" area in the green area near the adjacent sensor but narrows as the distance increases from the adjacent sensor, and reaches its maximum area is not sensitive in the area of maximum penetration of green light from the adjacent sensor diagonally light which has penetrated the lower attenuation point (the vertex of confluence of the four pixels, see FIG. 41), minimizing the noise between pixels.

Some microelectronic technologies not allowed in the rules of design and photo-lithography lines drawn at any angle, only vertical, horizontal and 45-degree angles, in which case the triangle absence of photo-active area of the sensor will be drawn from the as indicated in FIG. 41 to the right of the photo-sensor green rightmost Bayer pattern. Other technologies are even more restrictive and allow only vertical and horizontal lines, in which case the "triangle" absence of active area would be designed as shown in the corner to the left of the green sensor at the left of FIG. 41.

The patterns presented in FIG. 41 seem very small, but we must remember that the wavelengths of the light spectrum can range from about 400 nanometers at the top of the blue spectrum to about 800 nanometers in the lower spectrum Red. While at the time of writing the patent, CMOS technology sub-micron to 28 nanometers were in production in high volume, indicating that almost any CMOS technology (or other past, present and future technologies) is easy to design geometries with dimensions much smaller than the wavelengths of visible light spectrum, which are fixing the minimum dimensions of the microlenses and micro-sensors to avoid diffraction phenomena.

The inventions described herein Granjean great advantages in the manufacture of large volumes of plenoptic sensors of very high quality at very low prices, also gain great advantages in terms of manufacturing sensing an increasing number of applications megapixel small size, allowing to reach limits in which wave phenomena of light waves no longer be ignored, some of which are described in detail below.

Structures as described herein may also be part of 3D chips, where the bottom structures as shown in FIGS. 14, 14.*b*, 22.B and 22.C, instead of being soldered on a circuit printed is located on another integrated circuit with a specific function, such as processing plenoptic.

Mentioned inventions can be combined with zooms micro-mechanics, in which one (s) of the optical lens moves sandwich (n) perpendicular to the axial axis driven by MEMS (Micro-Electro-Mechanical Systems, or Micro Electro Mechanical Systems), and can thus refocus the image or use the structure as an optical zoom.

The mentioned inventions can be combined with externally controllable static zooms, in which one (s) of the lenses of the optical sandwich changes (n) the (s) distance (s) focal (s) under the control of an external parameter (one voltage, current or other parameter) can thus refocus the image or use the structure as an optical zoom.

The main prototypes and the first products on the market use microlenses as described in the "state of the art", the use of photo-sensors and micro-lenses as described herein gives them the advantages of application We described below.

Usage Examples Showing Differences from the Prior Art

Photo-sensors using pixel geometries as described in FIG. 41 can be used to capture images of a very high density of pixels in a very small space with results contrast between pixels dramatically improving the state of the art, increasing the signal/noise ratio between adjacent pixels; include applications such as mobile phone cameras, tablets or laptops with very high megapixel count and growing more and very small size (sensors occupy less than 1 cm×1 cm). This invention is applicable to both traditional sensors (without microlenses plenoptic) as light field sensors (with microlenses plenoptic) but especially beneficial in this latter case, as the balance between the number of pixels per micro-lens (to discriminate more directions of arrival) and a number of increasingly high micro-lenses in order to increase the number of usable push megapixel sensors with a total number of pixels beyond the current state of the art, leaving away the limits Moore's Law but alleviating as far as possible the phenomena light wave leading to unwanted refractions for very small pixel dimensions.

If you can relax the specifications in terms of number of megapixels per unit area, as shown in FIG. 40, or more on the 39, which also allows the use of photo-sensors technologies lowest cost (or using dense technologies increase the number of megapixels per unit area sensor), you can reach a number of very high (beyond the current state of the art) with very high luminous efficiency megapixels and a high contrast in a chamber size Normal/large for applications where space is not a major design criteria (for example, in a DSLR sensor size can be several cm each side). Also for applications in portable devices (phones, tablets, laptops, . . . ) you can achieve very high contrast and very high image quality (with low noise) for applications where high number of megapixels is not the goal fundamental quality can be very high in case the pixel area containing the first full Airy circle (as described in FIG. 39) under these circumstances 84% of the incident light reaches the photo-sensors, just would appreciably increase the sensitivity and contrast of a given sensor should multiply by 4 sensors area (to include the second lobe Airy in the area of sensor) technology. The claims carried out in this paragraph apply to traditional sensors and digital cameras, but are especially useful for sensors plenoptics cameras, since the number of microlenses grow exponentially and thus the number of pixels specified for discriminating a large number of directions.

The mentioned inventions improve the state of the art in terms of density of pixels to the point that the dominant factor that starts to deteriorate the efficiency sensor/camera is the diffraction light, especially in the red colors of longer wavelength and So the first to start diffracted. These inventions can be used in normal or in plenoptics sensors and applications sensors are described below.

Inventions as set forth in FIGS. 14, 14.B, 15, 16, 17, 18, 22, 22.B, 22.C, 23 and 26 can result plenoptics sensors in which, with an appropriate process information on the pixels, you can get information not only on the intensity of color in the pixels, but also the arrival direction of the light rays, leading to new applications in which it is possible to re-focus images in a plane the different level focused on photography shot real world, you might get completely focused images (at all points of the picture), to obtain 3D images (three-dimensional) for 3D displays on movie screens or monitors with glasses active (with stereoscopic images) screens/monitors with passive glasses or new and future screens/3D displays without glasses. The number of pixels and the number of possible planes focused at different depths (which increases linearly with the number of pixels per micro-lens) increases dramatically thanks to the use of inventions.

Plenoptic sensors and developed with the inventions described can be used in small portable cameras from a number of photo-sensors relatively small, even in professional cameras with sophisticated optics and a high number of pixels. The main advantages over other plenoptic techniques that integrate microlenses plenoptic a discrete level in the lens of the camera or an array of microlenses discreetly located in a plane in front of the plane of the sensor, process capability wafers using manufacturing techniques similar to those used in microelectronics also for optics, sensors plenoptic obtaining high-quality, lower costs and manufacturing processes that lend themselves to very high volume productions, while reducing optical aberrations and increase the number of microlenses per unit area and the total number of pixels.

One of the drawbacks of plenoptic technologies is the number of pixels resulting, depending on the algorithms used, and possible techniques of super-resolution and interpolation of intermediate pixels in the final image (post-processed plenoptic algorithms) will result a number of pixels in the image lower than the number of pixels of the sensor; at the low end some algorithms offer a number of pixels equal to the number of microlenses plenoptic. This fact, coupled with the fact that to discriminate arrival directions of rays requires a number of pixels for possible microlensing the highest in the end would lead to microlenses and sensors beyond the state of the art.

The monolithic integration of micro-lenses using advanced micro-electronic processes and/or micro-optics, for example in CMOS techniques have reached very high sophistication due to the large investments made for microprocessors, memories and other logic circuits, allow to have very sophisticated means of design and production are also applicable to the microlenses plenoptic, allowing the manufacture of micro-lens arrays plenoptic a number of lenses beyond the state of the art and with fewer optical aberrations than equivalent discrete.

To appreciate the advantages of the inventions disclosed in this patent, we discuss specifications for future technologies image acquisition today impossible to implement. Suppose you intend to manufacture a 3D HDTV video camera (application where today two chambers are used in parallel to produce stereoscopic images, more than doubling the cost of manufacturing, dramatically increasing costs and decreasing post-process the image quality) in principle there would be two possibilities, try using a micro-lens 1280×720 lenses (921,600 microlenses) or 640×360 (211,260 micro-lenses) with an algorithm for super-resolution associate to raise the final number of 1280×720 pixels. Suppose also use a reasonable standard of 16 pixels by microlensing (leading to 7 focus planes), this would lead to a sensor of Ser. No. 14/745,600 pixels in the first case or 3,686,400 pixels when using super-resolution, especially the first value is extremely high, toward the edge of the state of the art at the time of writing this patent. In case of trying to increase the quality of 3D images and sue 21 focused plans, would lack 111.5 megapixel sensors without using super-resolution or 25.6 Megapixels using the super-resolution 2-1, clearly beyond the state Art to write the patent, especially for consumer applications of very low cost.

One of the first industrial sensors plenoptic announced, will be available in volume during the second quarter of 2014, publicized on the attached link (http://lightfield-forum.com/light-field-camera-orototypes/toshiba-lightfield-camera-module/), contains an array of 500,000 microlenses of 30 microns in diameter (number between the two required for HDTV camera cited in the above example) and a CMOS 8 Mega-ray sensor (also located between the two requirements above) in an area of 7×5 mm. Although there are no published data on the technology, its implementation may have been carried out similar to those set forth in 6. For, 6.B or 8.A figures techniques 8.B. According to the same web link mentioned above, the discrete implementation of FIG. 6.B has a number of microlenses 5 times lower than plenoptic sensor referred to in our example, relatively low in the light of the inventions disclosed in this patent numbers.

From the discussion in the preceding paragraphs it follows that the state of the art could only implement a HDTV camera thanks to the use of algorithms super-resolution, always with a lower quality algorithms without super-resolution using a greater number of micro-lenses. The microelectronic processes described in the inventions of this patent, including photolithography processes are capable of producing a number of microlenses than the maximum of 500,000 microlenses announced in the previous web also notably that it is mentioned in the documentation about the "radio" of the microlenses makes us think that they are circular rather than square, always less efficient, as the area between several circles makes waste some of the pixels of the photo-sensor, and also wastes of the incident light energy.

If the design criteria were a sensor for a camera for 3D films in order to obtain 4000×3000 pixels, could be designed again with 12 Mega-lenses in the microlens array plenoptic (192 mega-pixel sensor assuming 16 pixels per micro-lens, focused only 7 planes) or 2000×1500 (3 mega-lens) in the plenoptic array (48 mega-pixel sensor) and a factor of 2 super-resolution; both specifications (especially the first) are well beyond the state of the art, and can be implemented only thanks to the use of micro-electronic techniques such as those described herein, both the microlenses to the sensors plenoptic such high integration density with adequate levels of inter-pixel noise. If you also pretend to have more than 7 planes focused in order to increase the quality of the 3D image, specifications far exceed the wildest dreams about the state of the art.

Finally, the use of meta-materials with indices of refraction less than 1 together with microelectronic processes described in this patent enable the monolithic integration of a complete object built on the sensor substrate; monolithic integrations as described in FIG. 22.B (with or without lenses plenoptic 5) will result in modules with costs considerably lower manufacturing costs of production offered today in implementations as described in FIG. 11 with automated production techniques that minimize maximum human intervention, reduce production costs and increase quality and efficiency of light and optical cameras; without going to compare it with cameras as set forth in the 5., 5.B, 7A, 7B and 7.C solutions become obsolete figures versus the use of sensors set forth herein.

DESCRIPTION OF FIGURES

FIG. 5.B. Plenoptic lenses FIG. 5.A mounted between the object space (left image), the main lens and a camera (right).

FIG. 6.B. An early industrial implementations of the invention of FIG. 6.A (an array of microlenses located plenoptic very small distance from the plane of the photo-sensors).

FIG. 7.B. Mechanical optical scheme of the pieces for the implementation of the structure of FIG. 7.A.

FIG. 7.C. Mechanical optical scheme of an implementation of the structure of FIG. 7 A.

FIG. 8.B. Similar to FIG. 8.A where the microlenses are placed on top of the transparent substrate implementation.

FIG. 8.C. Implementing a monolithic structure which places an array of microlenses 10 over a sensor array constructed on a substrate 30 of photo-sensors 100.

FIG. 9.B. State of the art of a substrate using photo-sensors technology BSI (Back Side Illumination).

FIG. 10.B. Evolution of the state of the art building color filters and micro-lenses on a substrate pixel photo-sensors beyond FIG. 10.A.

FIG. 10.c. Top view of FIG. 10.B.

FIG. 14.b. Similar to the above (FIG. 14) in which the material of low refractive index has been replaced by air (or other gas) deployment and microlenses wafer is maintained at a distance sensor wafer thanks to the use separators.

FIG. 22-b Miniaturizing sizes thanks to the use of materials (or meta-materials) with indices of refraction less than 1 (layers 4, 4', 4'', 4''' and 4''''), which makes possible the implementation of a full monolithic target including several lenses (5'''' 5''', 5'', 5') and the microlenses plenoptic (5).

FIG. 22.C. Implementation of the invention similar to FIG. 22.B replacing material for low refractive index air (or other gas) and maintaining the wafers spaced including optical and optoelectronic wafer by spacers functionality.

FIG. 25.B. Top view of FIG. 24, showing the construction of a 4×4 array of micro-lenses on 4×4 photo-sensors and the nearest part of photo-sensors such substrate.

FIG. 27.B. Representation (at the top of the figure) of a "quadri-circle" resulting Airy using pixel microlenses as described in FIGS. 24, 25 A, and 25 B, compared to what would be the Airy circle and ring (at the bottom of the figure) if the optical disc has a circular shape.

FIG. 33.B. Irradiance distributions associated with four contiguous images of specific objects in the object space, projected onto four adjacent pixels in the plane of sensors across four adjacent microlenses. The pixels are reduced to their minimum acceptable dimensions in order to avoid diffraction caused by nature wave of light; in order to increase the pixel density, peak (maximum) of Airy disks they are located on the zeros irradiance of adjacent pixels.

REFERENCES

Figure 1:
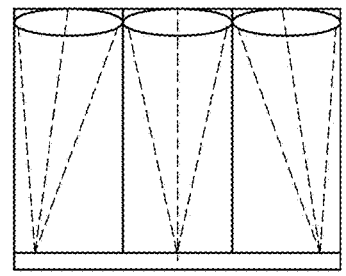
FIG. 1. Description of a possible implementations of the prior art for a plenoptic sensor.
Figure 2:
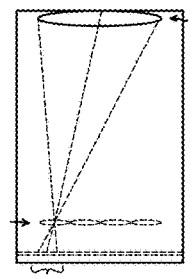
FIG. 2. Description of a second possible implementation of the prior art for a plenoptic sensor.
Figure 3:
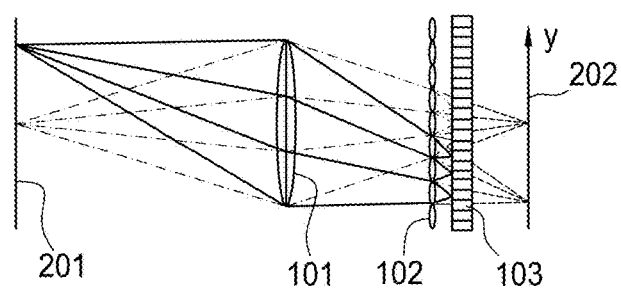
FIG. 3. Projecting plenoptic rays on a sensor in case the plane is focused behind the sensor.
Figure 4:
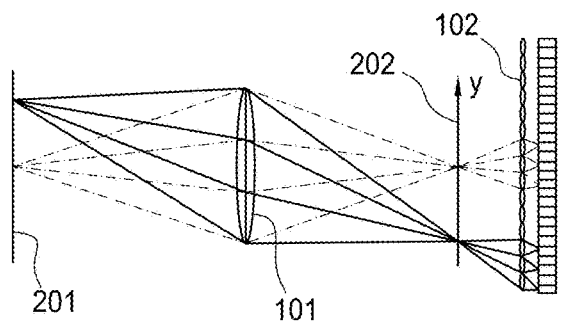
FIG. 4. Projecting plenoptic rays on a sensor in case the plane is focused in front of the sensor.
Figures 5A, 5B:
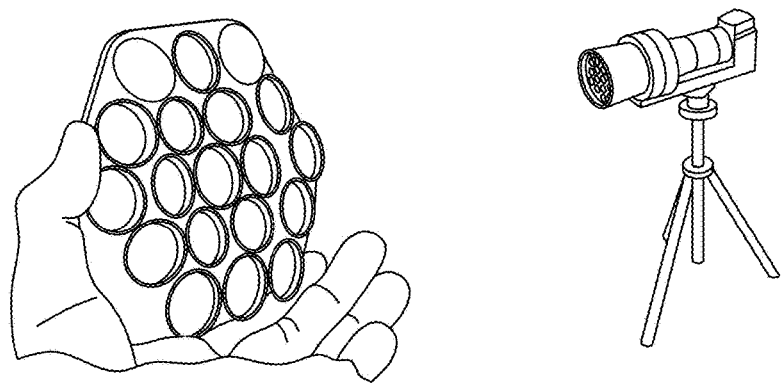
FIG. 5.A. Implementation of plenoptic lenses in which the microlenses are located between the main lens and the object space.
Figure 6A:
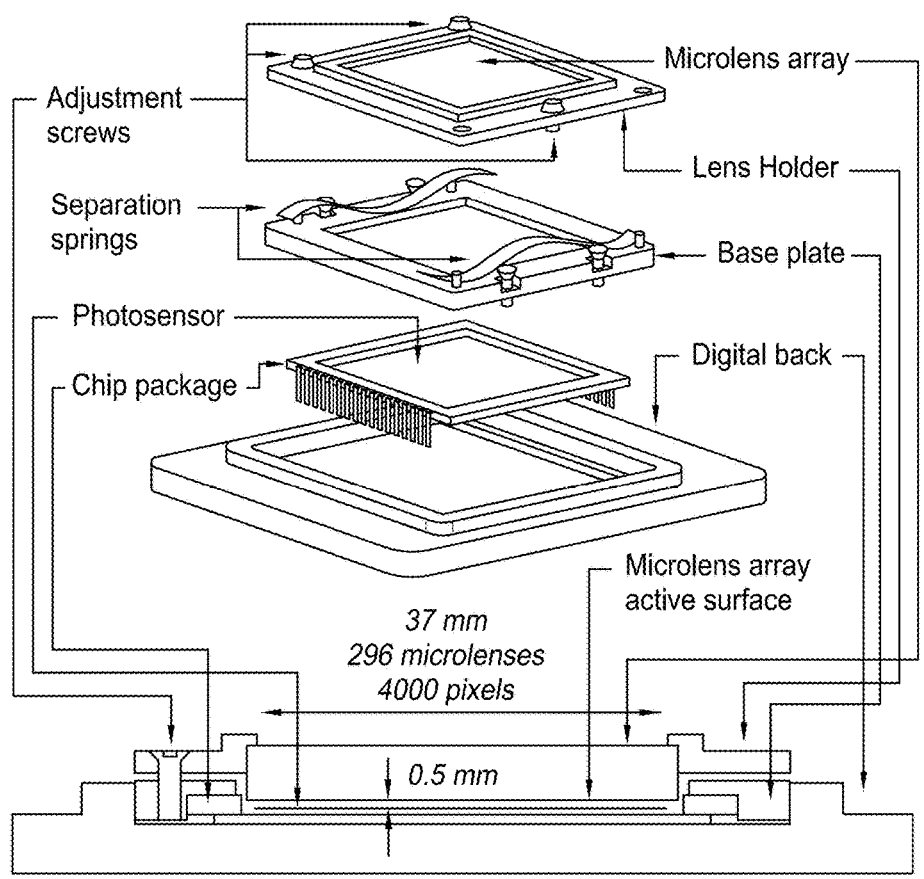
FIG. 6.A. Implementation of an array of microlenses plenoptic located on a very small distance (0.5 mm) from the plane of the photo-sensors.
Figure 6B:
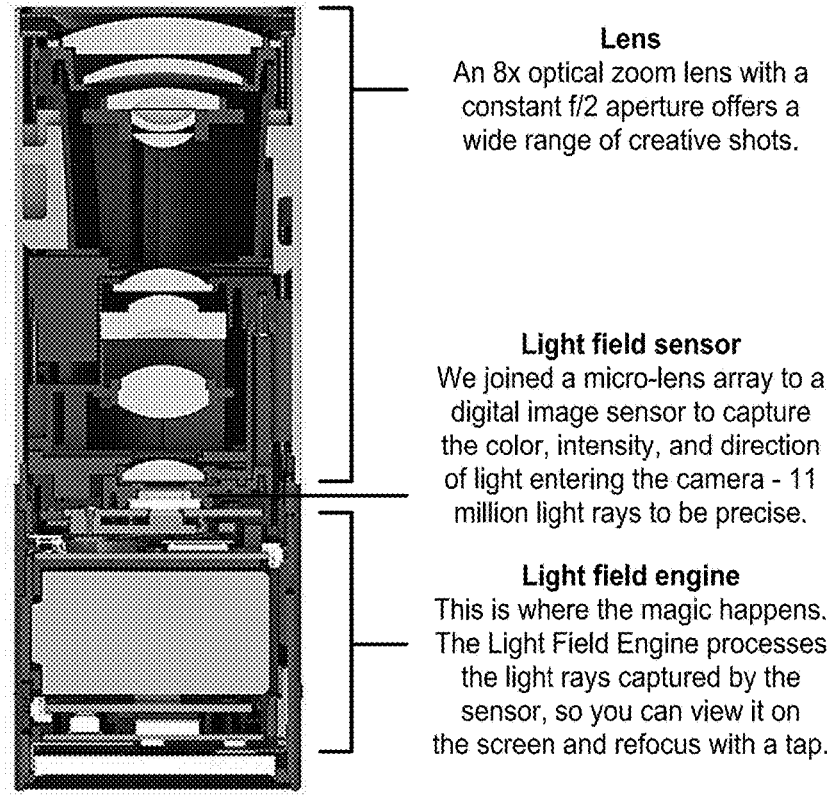
Figure 7A:
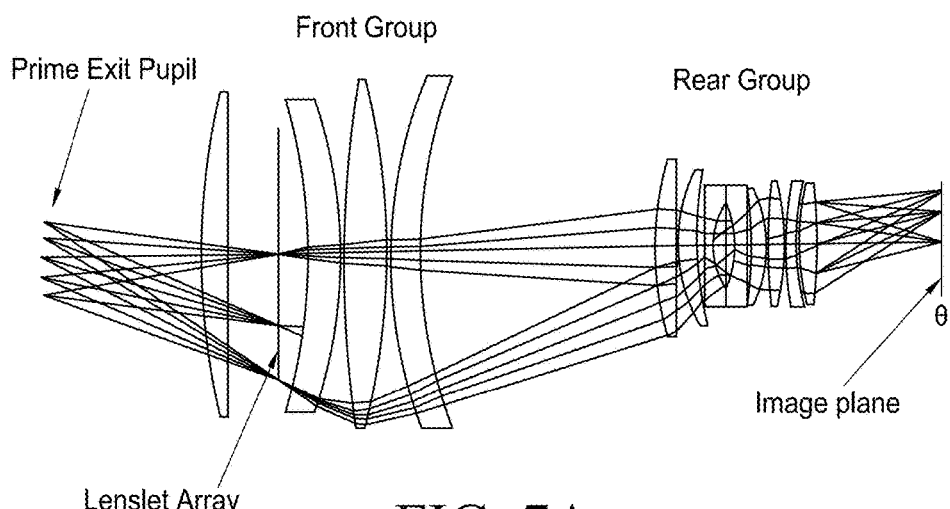
FIG. 7.A. Optical schematic of an implementation in which the microlenses plenoptic part of a lens (lens group), placing between the first input objective lens (left) and the other lenses (right).
Figure 7B:
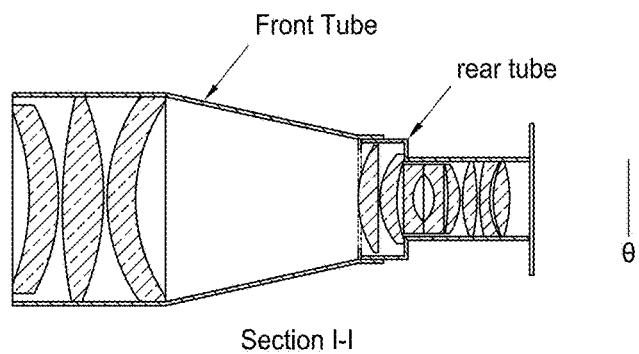
Figure 7C:
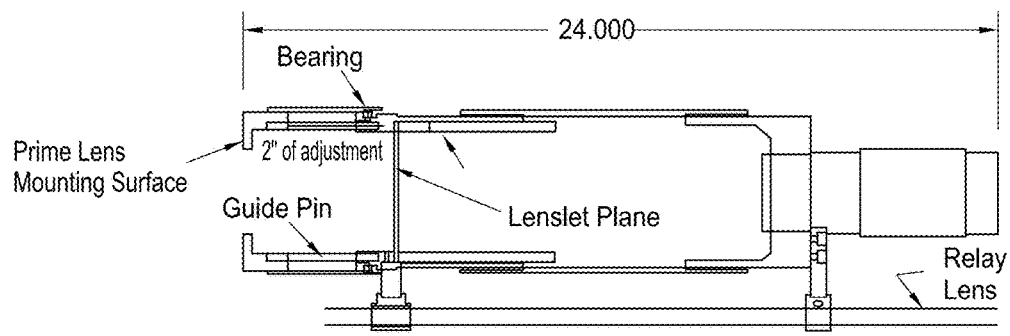
Figure 8A:
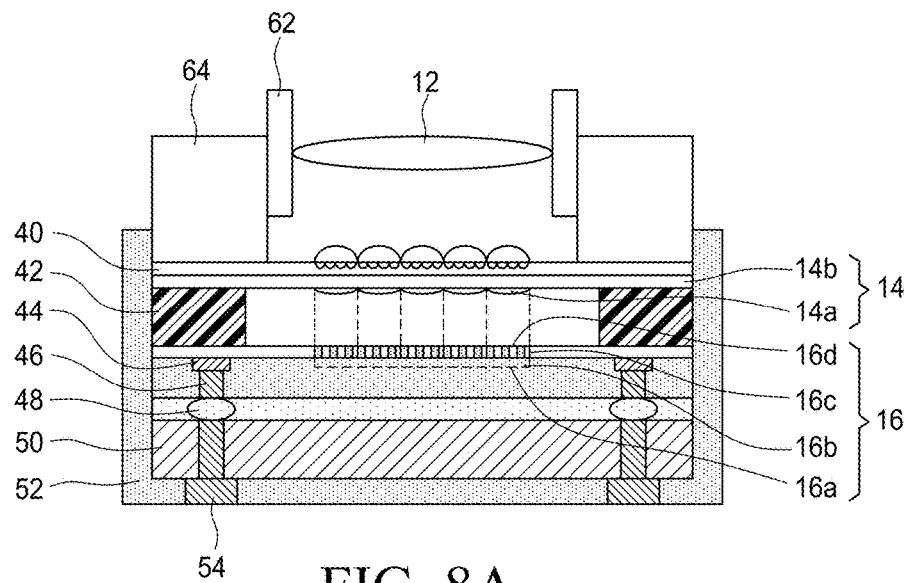
FIG. 8.A. Implementation on a substrate where the photo-sensors plenoptic the microlenses (constructed on a transparent substrate 14b to very small distance from the photo-sensors thanks to the use of resin separators 42 between the photo-sensors and the substrate are placed the microlenses).
Figure 8B:
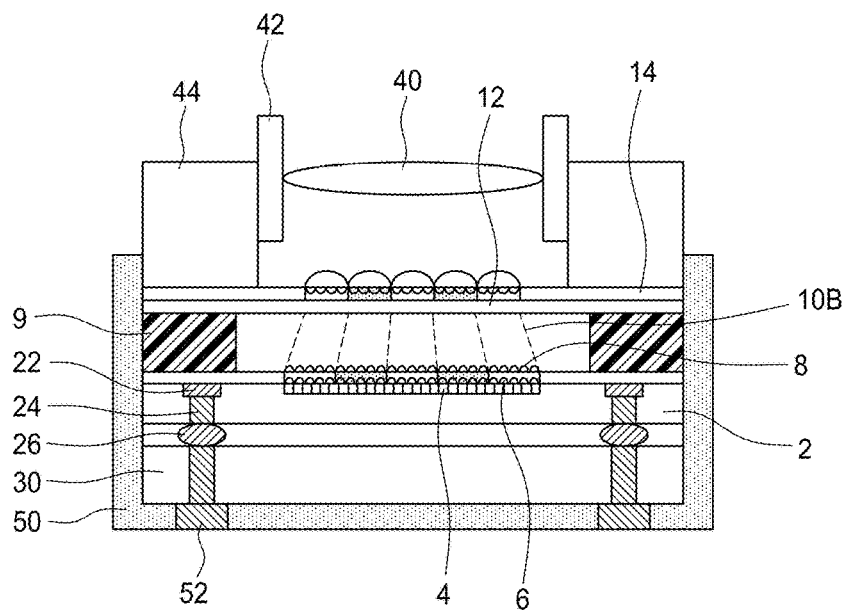
Figure 8C:
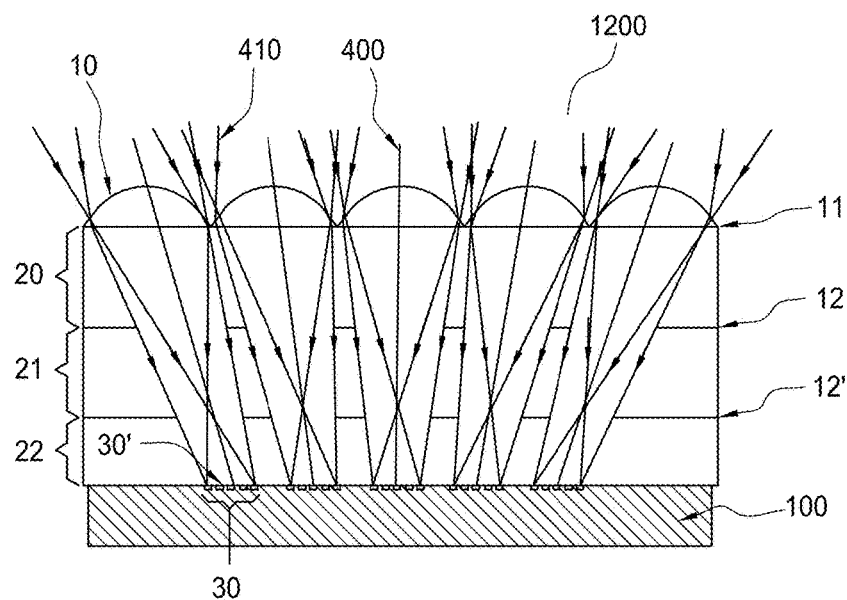
Figure 9A:
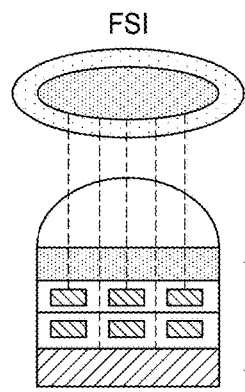
FIG. 9.A. State of the art of a substrate using photo-sensors technology FSI (Front Side Illumination).
Figure 9B:
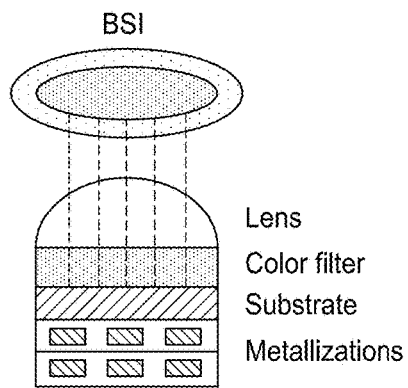
Figure 10A:
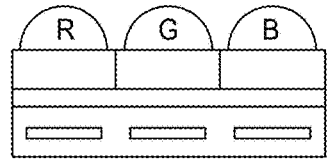
FIG. 10. A. State of the art building color filters and micro-lenses on a substrate pixel photo-sensors.
Figure 10B:
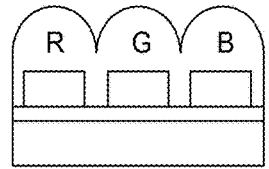
Figure 10C:
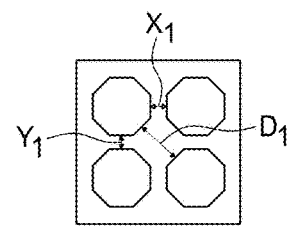
Figure 11:
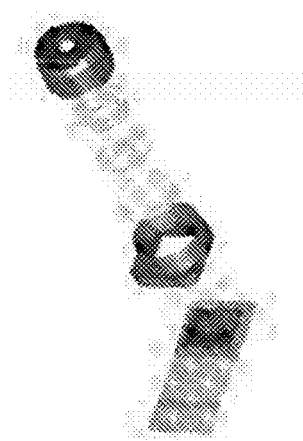
FIG. 11. Camera Module for portable applications (mobile phone, tablet, laptop), comprising photo-sensor (mounted on a flexible printed circuit) and a mechanical support for placing the lenses on the photo-sensor.
Figure 12:
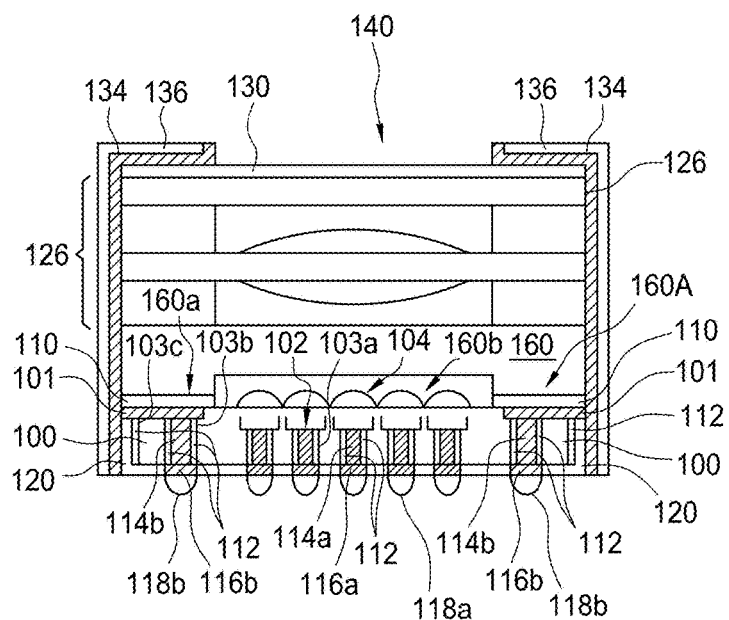
FIG. 12. Camera Module for portable applications (mobile phone, tablet, laptop), comprising photo-sensor (mounted on a packaging for integrated circuit) and a lens (126) of two elements on a transparent substrate, all wrapped in an opaque conductive pattern which protects electromagnetic radiation and provides mechanical strength to the assembly.
Figure 13:
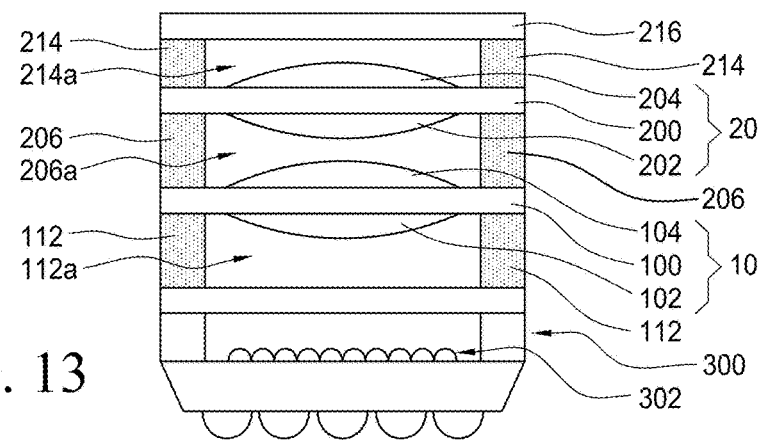
FIG. 13. Camera module for portable applications (mobile phone, tablet, laptop), similar to FIG. 12 but two lens mounting two elements on two transparent substrates, and a third transparent substrate to protect the structure.
Figure 14:
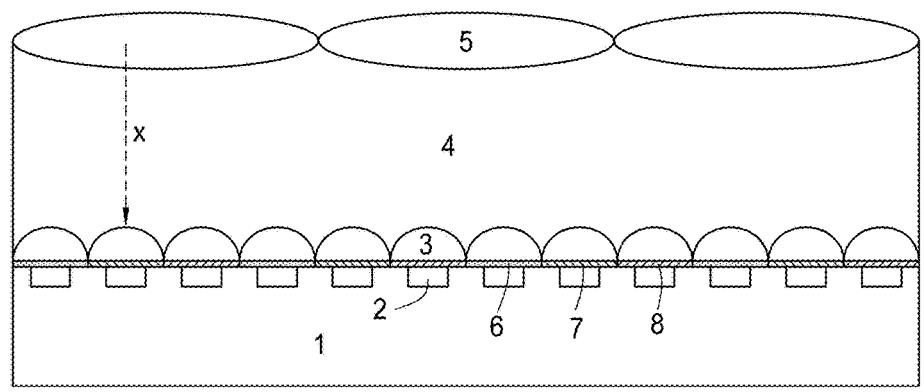
FIG. 14. Implementation of some of the inventions of this patent, containing a substrate (1) on which photo-sensors (2), on which color filters are located (6, 7 and 8) are constructed micro-pixel lenses (3), a low refractive index material (4) and the microlenses plenoptic (5).
Figure 14B:
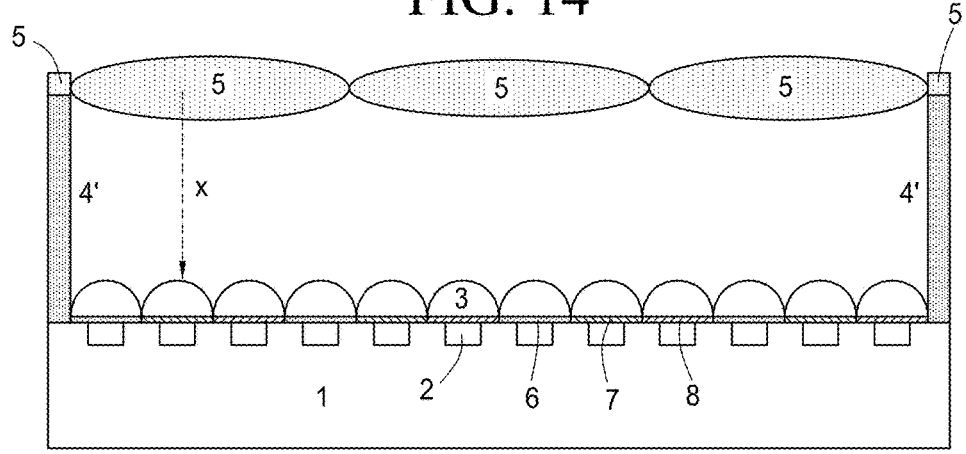
Figure 15:
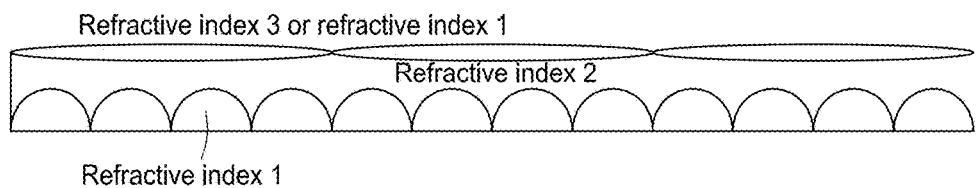
FIG. 15. Example of a second implementation of some of the inventions.
Figure 16:
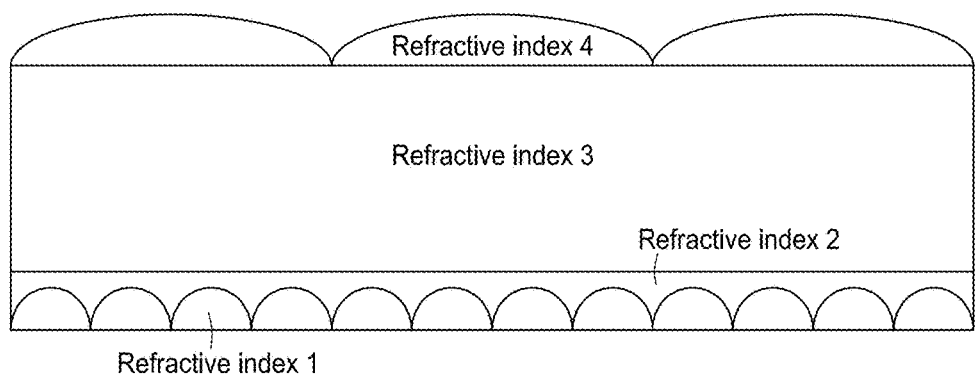
FIG. 16. Example of a third implementation of some of the inventions.
Figure 17:
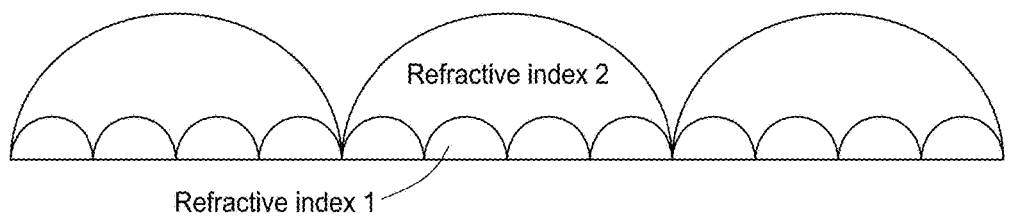
FIG. 17. Example of a fourth implementation of some of the inventions.
Figure 18:
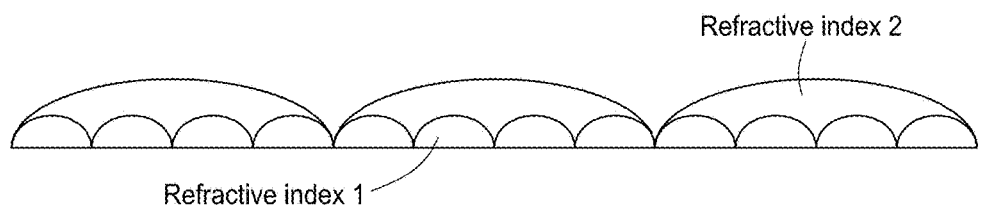
FIG. 18. Example of a fifth implementation of some of the inventions.
Figure 19:
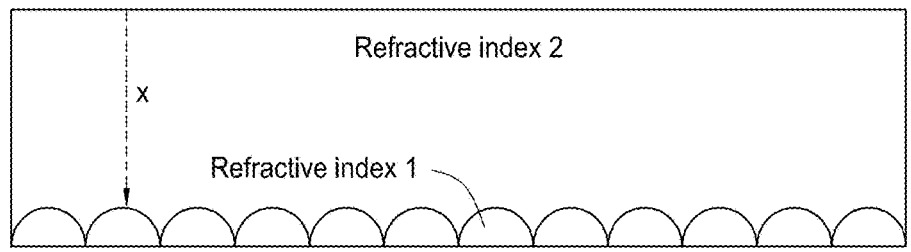
FIGS. 19, 20, 21, 22. Details of a sequence of manufacturing a inventions: plenoptic microlenses on the microlenses of the optical pixel using processes normally used in microelectronics processes that lend themselves to processing wafers to manufacture high volumes with very high quality and very low cost.
Figure 20:
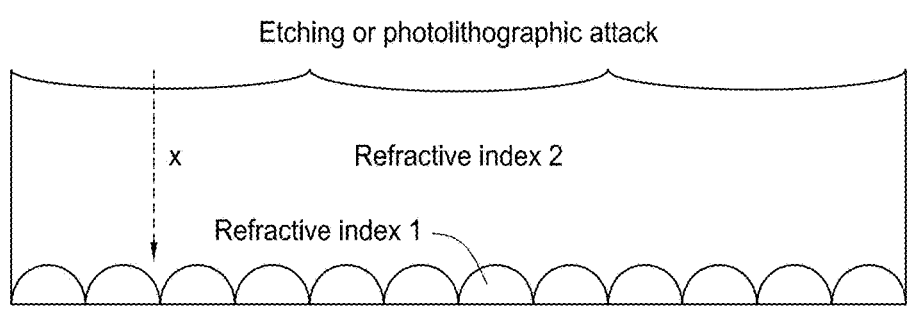
Figure 21:
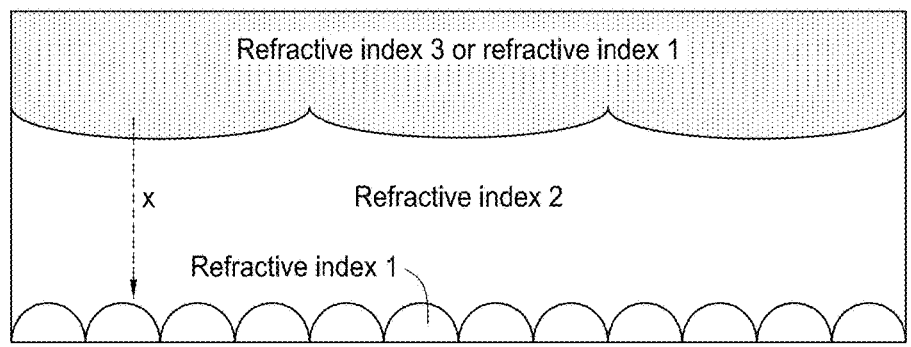
Figure 22:
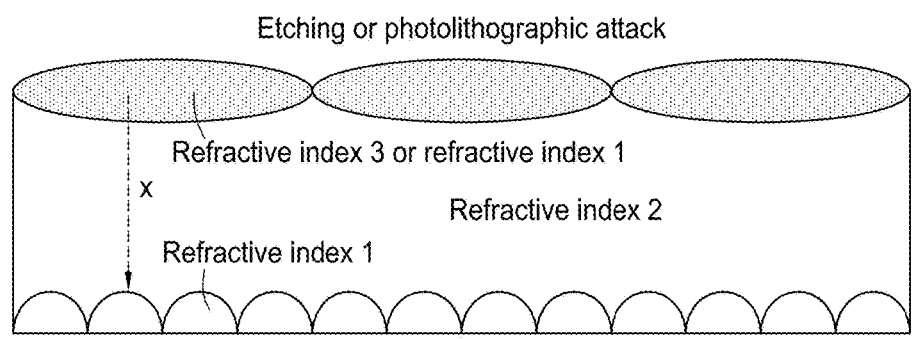
Figure 22B:
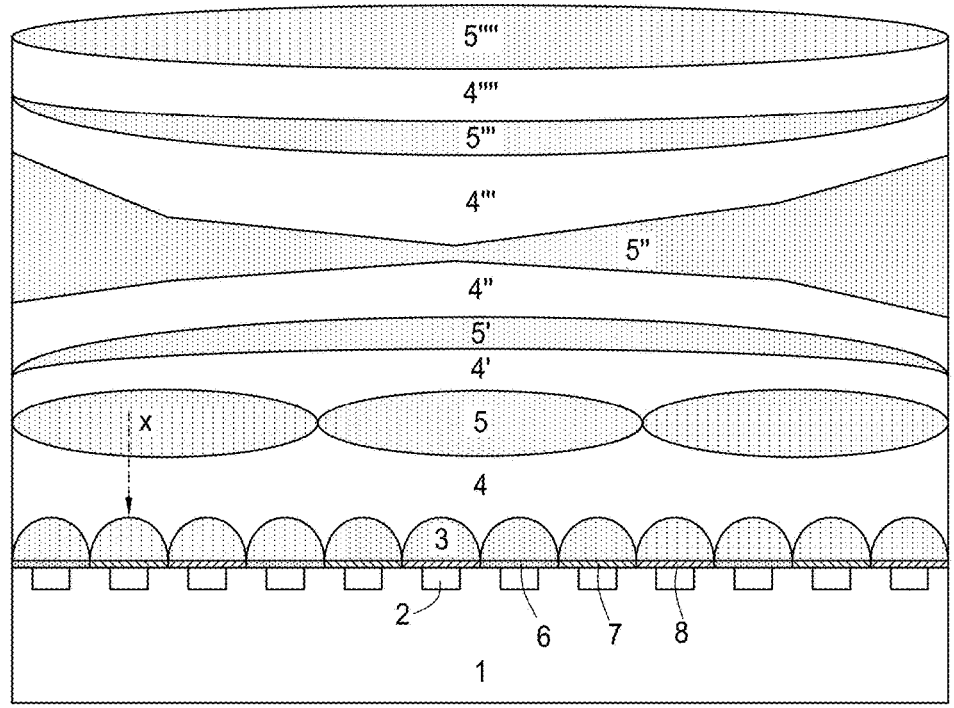
Figure 22C:
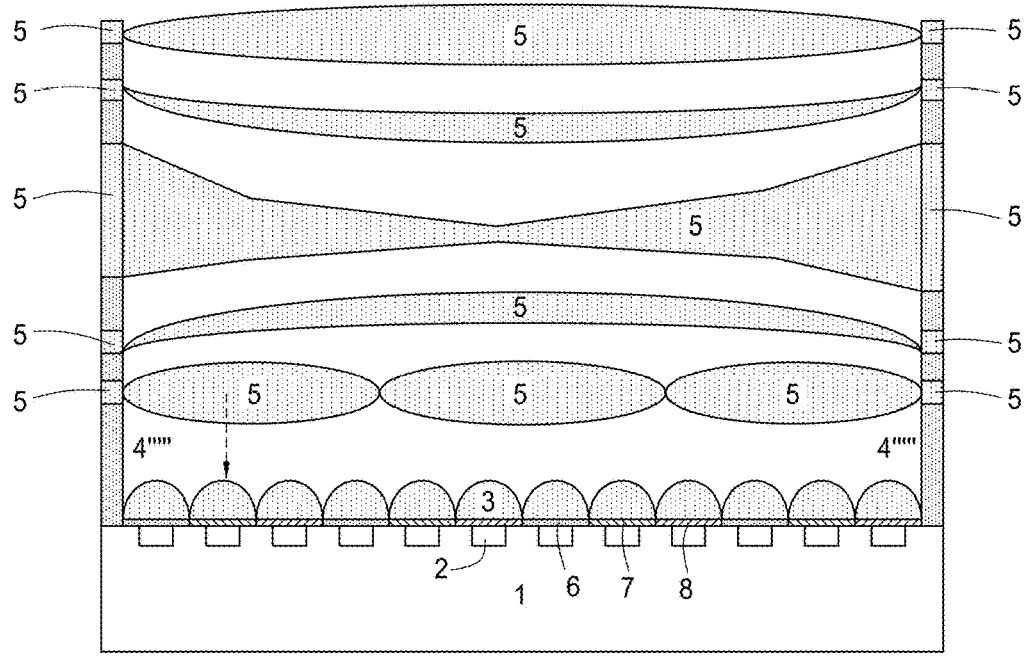
Figure 23:
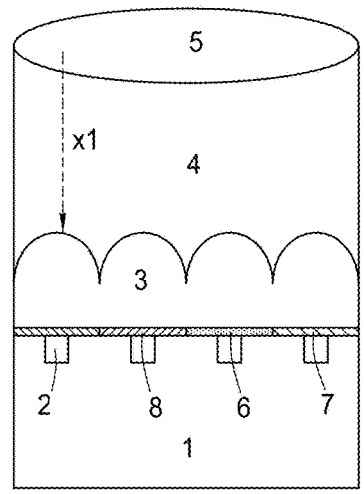
FIG. 23. Example of an implementation similar to the FIG. 14 inventions in the area of the photo-sensors is relatively low compared to the total area of the substrate of photo-sensors and therefore the microlenses plenoptic (3) have a thickness on the top substrate in the implementation FIG. 14 view.
Figure 24:
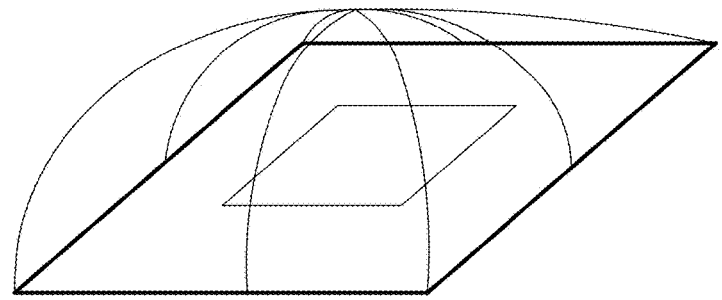
FIG. 24. Details of the construction of a micro-lens (composed of 4 sectors spherical or aspherical) on a photo-sensor and the portion of the substrate closest to said photo-sensor.
Figure 25A:
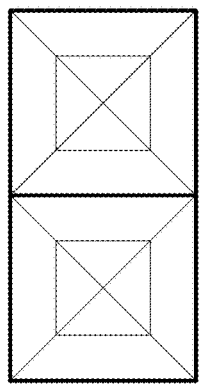
FIG. 25.A. Top view of FIG. 24, showing the construction of two micro-lenses on two photo sensors, including the part nearest to said photo-sensor substrate.
Figure 25B:
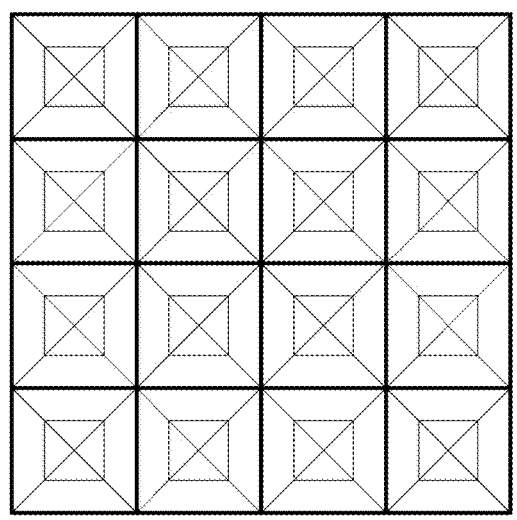
Figure 26:
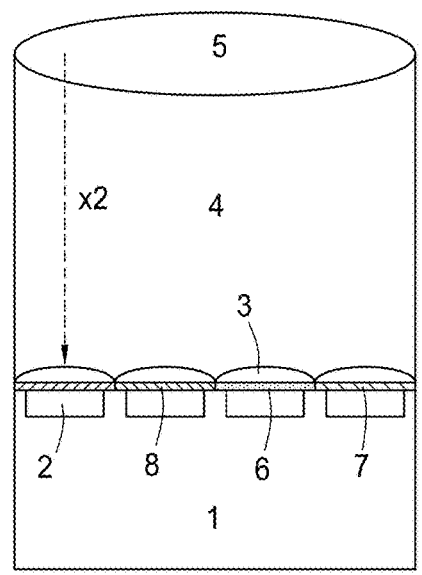
FIG. 26. Cross section B of FIG. 25, showing the construction of a micro-lens plenoptic (5) on a material of low refractive index (4), located on the 4×4 array of pixel microlens (3), located on a 4×4 array of color filters (8, 6, 7), in turn located on a 4×4 array of photo-sensors (2) built on a substrate (1).
Figure 27A:
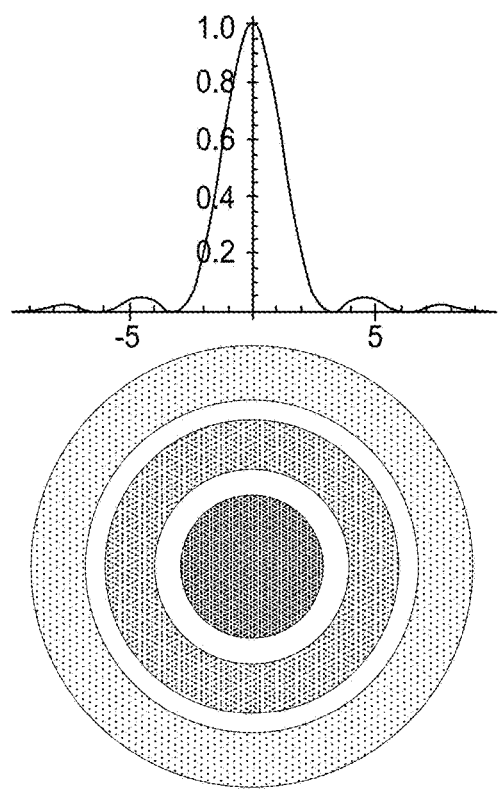
FIG. 27.A. Irradiance distribution associated with the image of a point object on the plane of sensors in a system with a round exit pupil, leading to discs and rings Airy (top of the figure shows the irradiance distribution in the vertical axis versus distance from the center point on the horizontal axis, in the bottom power levels are shown by the intensity of the gray).
Figure 27B:
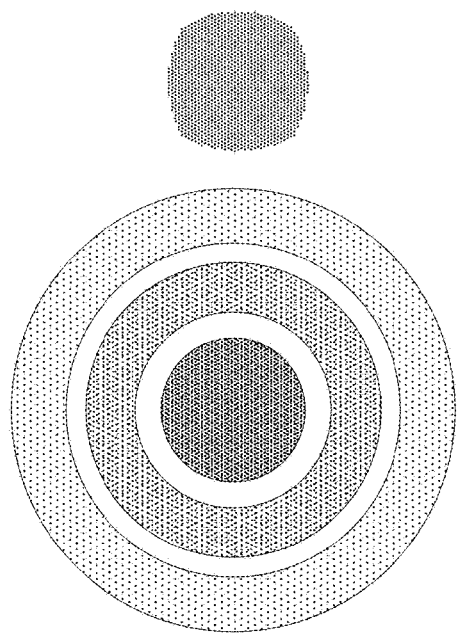
Figure 28:
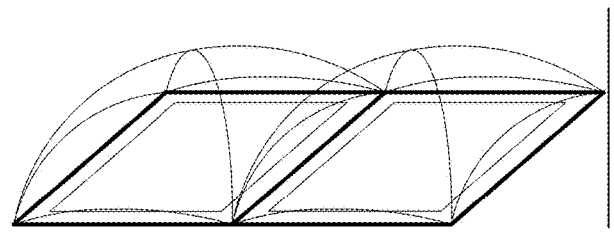
FIG. 28. Micro-pixel lenses overlapping each other in a topology in which the percentage of photo-sensor area to the total area of the substrate is high and the thickness of the microlenses to fulfill its function imposes such overlap.
Figure 29:
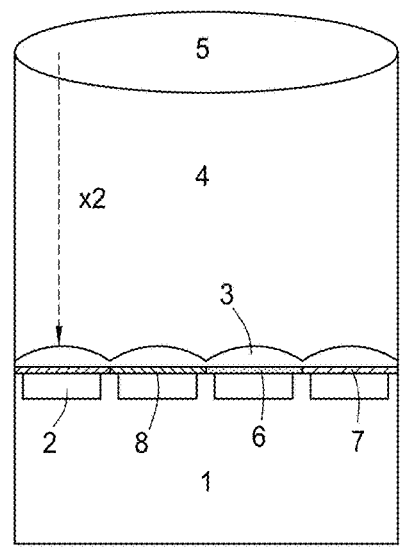
FIG. 29. Figure lateral section 28 including substrate (1), photo-sensors (2), color filters (6, 7, 8) pixel microlenses (3) low refractive index layer (4) and plenoptic micro-lens (5). Note that the layer 4 of low refractive index never actually touch the color filters (8, 6 and 7).
Figure 30:
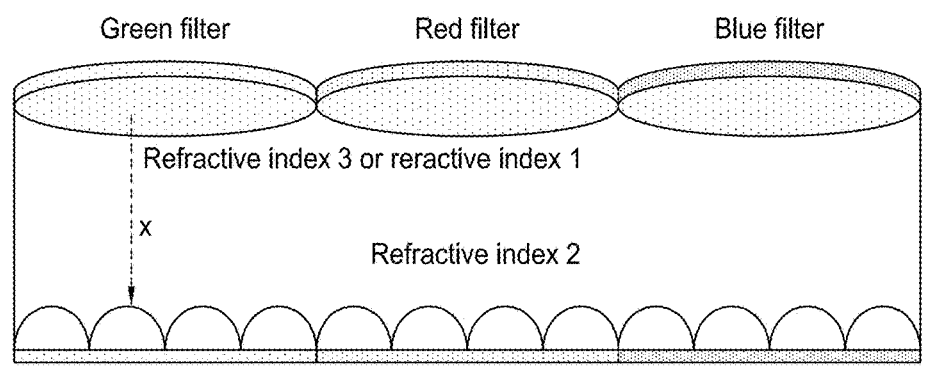
FIG. 30. Structure in which the color filters are grouped by microlensing plenoptic, and have been distributed to the layer under the microlenses pixel and the microlenses plenoptic. They can also fulfill the mission of infrared filter.
Figure 31:
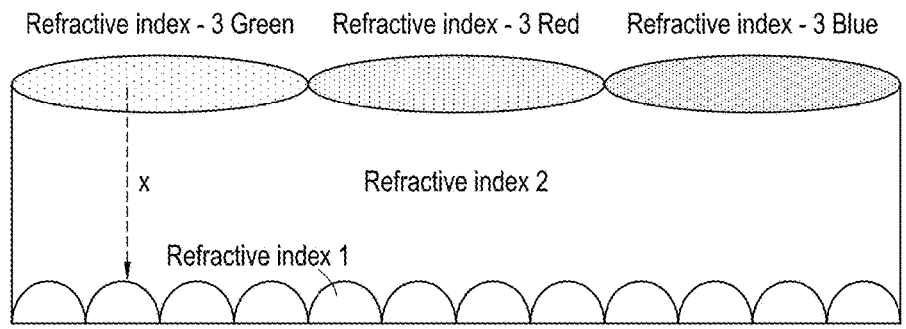
FIG. 31. Structure in which the color filters are grouped by microlensing plenoptic, providing such microlenses plenoptic with a second function, to be built with a material that besides producing the required change of the refractive index is selective to the passage of colors.
Figure 32:
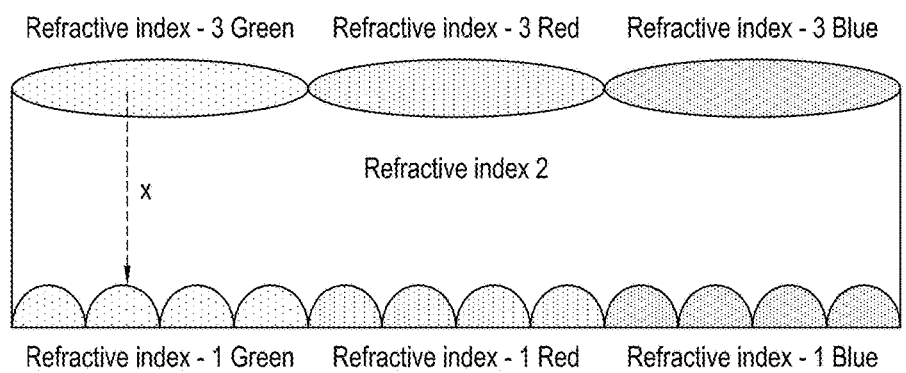
FIG. 32. Structure in which the color filters are grouped into the microlenses plenoptic and the microlenses pixel, providing all the microlenses (plenoptic and pixel) of a second function, to be built with a material that besides producing the required refractive index change is selective to the passage of colors.
Figure 33A:
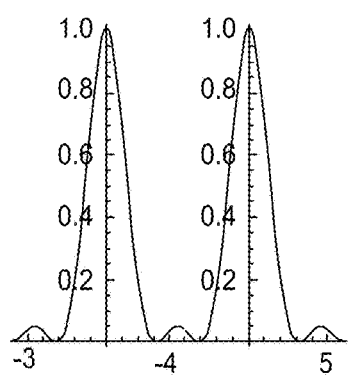
FIG. 33.A. Irradiance distributions associated with images of two adjacent point objects in the object space projected onto two adjacent pixels in the sensor plane through two adjacent microlenses, resulting in two non-overlapping Airy disks and two interfering rings Airy including in an area between pixels.
Figure 33B:
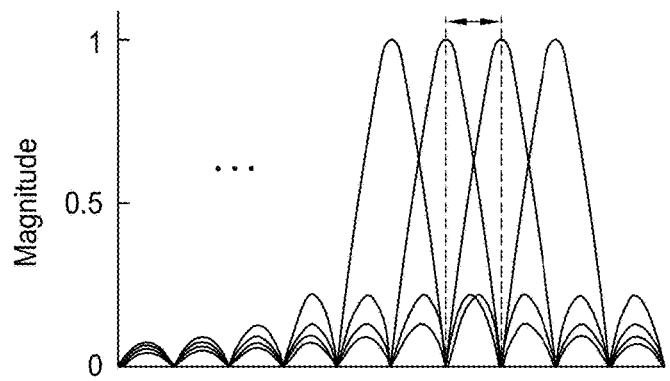
Figure 34:
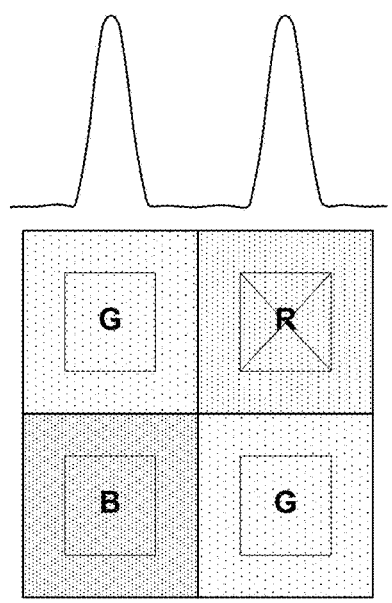
FIG. 34. irradiance distributions Bayer pattern on a green pixel and a red pixel (on the blue would be similar) where the microlenses, the areas of the photo-sensors and opaque areas between photo-sensors, have been dimensioned so that the main lobe (the circle Airy) is fully reflected in the area of the photo-sensor, and the second and third lobes (rings Airy second and third) bearing on an opaque area without photo-sensors.
Figure 35:
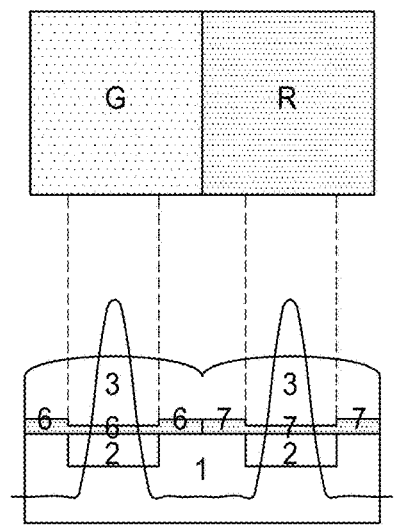
FIG. 35. Cross section of FIG. 34, wherein it is seen (bottom-up) the substrate photo-sensors (1), the photosensor (2), green color filters (6) and red (7) and pixel microlenses (3). Color filters, in the area of the substrate where no photo-sensors are located on a metal layer (used for polarization and/or reading) or other opaque material. The magnitude of the irradiance of the two circles of green and red Airy contained entirely in the area of photo-sensors is shown.
Figure 36:
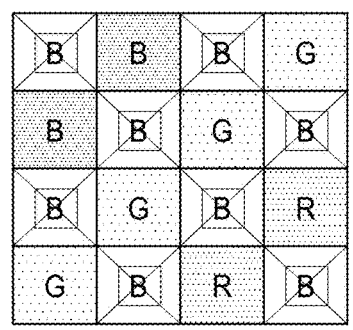
FIG. 36. Pattern, more sensitive to inter-pixel noise Yotsuba the Bayer pattern, as there are more pixels of the same color diagonally interfering with each other.
Figure 37:
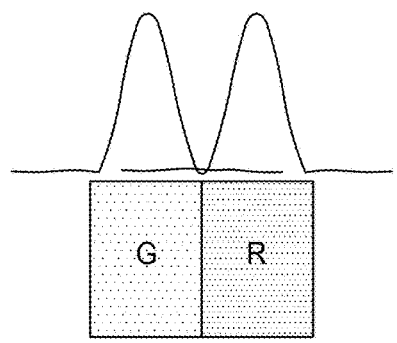
FIG. 37. In order to increase the density of pixels per unit area it has been accepted that the second and third lobes of irradiance may interfere neighbor pixel.
Figure 38:
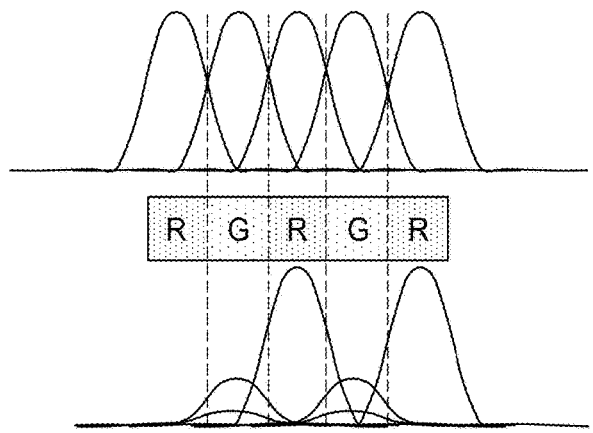
FIG. 38. In order to further increase the density of pixels per unit area has even accept Airy peaks are located in the neighboring pixel zeros, accepting that not all the energy of the main lobe will be used by sensors, interference between pixels of different colors is minimized by filtering colors.
Figure 39:
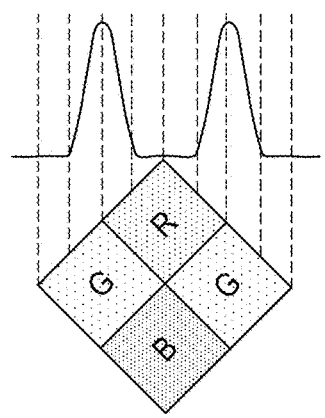
FIG. 39. The most critical in terms of inter-pixel noise pixels are the same color (green in a Bayer pattern) and diagonally adjacent, as its interference can not be filtered.
Figure 40:
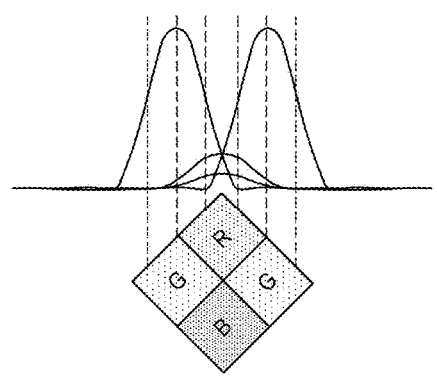
FIG. 40. The distance between adjacent pixels of the same color will be fixed by the/maximum acceptable signal to noise ratio for the application, which will deteriorate drastically as the first lobe of a pixel Airy start interfering with the first lobe of the Airy adjacent pixel of the same color (both green in a Bayer pattern).
Figure 41:
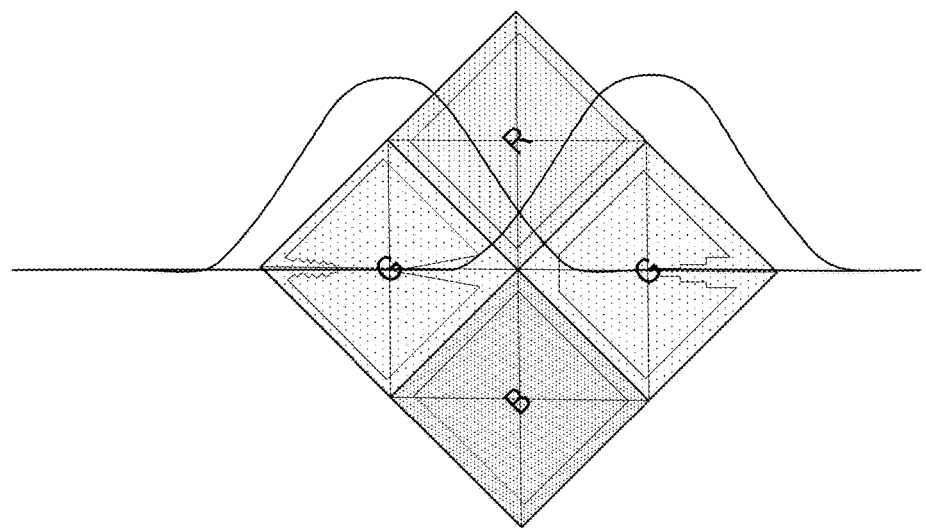
FIG. 41. The distance between adjacent pixels of the same color will be fixed by the/maximum acceptable signal to noise ratio for the application, which will deteriorate drastically as the first lobe of a pixel Airy start interfering with the first lobe of the Airy adjacent pixel of the same color (both green in a Bayer pattern), which can be minimized by special geometries for the photo-sensors of adjacent pixels of the same color, in which the vertices of the squares of the photo-sensors away not building the neighboring pixel active area of photo sensor in pixel next to neighboring areas.

1. V. G. Veselago (1968 (Russian text 1967)) . . . Sov. Phys. Usp. 10 (4): 509-14. Bibcode: 1968SvPhU.10.509V. doi: 10.1070/PU 1968v010n04ABEH003699
2. Negative Refraction at Visible Frequencies, Henry J. Lezec et al., Science 316, 430 (2007); DOI: 10.1126/science. II39266.

The invention claimed is:

1. Plenoptic sensor comprising:
a substrate with photo-sensors;
a single layer or plurality of layers of materials of low refractive index positioned on said substrate with photo-sensors, whose thickness is from values close to the focal length of the plenoptic lenses to near zero;
plenoptic lenses constructed with a material of high refractive index and located on the single layer or plurality of layers of materials of low refractive index,
pixel microlenses between the photosensors and the single layer or plurality of layers of materials of low refractive index, wherein the alignment between the plenoptic lenses and the pixel microlens with photo-sensors, and the alignment between the other elements of the optical components are less than a tenth of a micron tolerances.

2. A plenoptic sensor comprising:
a substrate with photo-sensors, pixel microlenses and plenoptic lenses constructed with a material of high refractive index.

3. The plenoptic sensor as described in claim 1 wherein the single layer or plurality of layers of materials are optical materials of various refractive indexes and are built on the substrate selected from among a CMOS, CCD or other photo-sensor technology for substrates.

4. The plenoptic sensor as described in claim 1 wherein the optical layers are constructed on the substrate with photo-sensors using techniques normally used for semiconductor processing: processing for wafers, deposition layers of materials, optical sandwich stacking wafers and/or electronic, separators, photo-lithography, positive or negative photo-resistive material chemical attacks with solvents, attacks with plasma, doped optical and electronic components materials that confer certain properties, heat treatments, curing by ultraviolet or thermal curing, packaging of circuits/sensors with different encapsulation, replication or solidification of liquid polymers upon exposure to ultraviolet light or thermal treatment, alignments between electronics and optics, or between the various optical layers, or the thicknesses of the optical coatings with tolerances reaching fractions of wavelengths in the range nanometric tolerances and lower.

5. The plenoptic sensor as described in claim 1 wherein the pixel microlens has a refractive index higher than the single layer or multiple layers of material of low refractive index.

6. The plenoptic sensor as described in claim 1, wherein color filters are added on the photo-sensor, on the plenoptic lenses, built in colored materials constituting the plenoptic lenses, built in colored materials constituting the pixel microlenses, or combinations thereof.

7. The plenoptic sensor as set forth in claim 6, wherein infrared or near-infrared filters are added, or infrared filters are constructed as part of the color filters.

8. The plenoptic sensor as set forth in claim 6, wherein the filters prevent the passage of visible light, allowing only the passage of infrared spectrum or other range relevant to the implementation.

9. The plenoptic sensor as described in claim 1, wherein the area of the photo-sensors and the distances between them are designed so that the photo-sensors have a substantially identical area to an area of a main lobe of a power distribution set by Airy disk or "quadri-circle" Airy, and a secondary lobe which illuminates an opaque area between adjacent photo-sensors.

10. The plenoptic sensor as described in claim 9, wherein the distances between adjacent photo-sensors are designed so that the peak power of the main lobe of a pixel lamp used to match the zero power of adjacent pixels, the active area of the photo-sensors is designed depending on the amount of acceptable noise between adjacent pixels and the signal/noise ratio is acceptable for application of the sensor.

11. The plenoptic sensor as described in claim 1, wherein areas of photo-sensors and photo-sensors densities per unit area are measured by the photo-sensor distances, wherein
the area of the photo-sensors and the distances between them are designed so that the photo-sensors have a substantially identical area to an area of a main lobe of a power distribution set by Airy disk or "quadri-circle", and a secondary lobe which illuminates an opaque area between adjacent photo-sensors, and
the distances between adjacent photo-sensors are designed so that the peak power of the main lobe of a pixel lamp used to match the zero power of adjacent pixels, the active area of the photo-sensors is designed depending on the amount of acceptable noise between adjacent pixels and the signal/noise ratio acceptable for application of the sensor.

12. The plenoptic sensor as described in claim 11, wherein the geometry of the active area of the photo-sensors at the pixel of the same color are designed so that the areas closest to the sensor of the same color located diagonally adjacent, with the aim of moving the active area of the light of the photo-sensor of the same color from the microlenses of adjacent photo-sensor, so that the final shape of the active area of the photo-sensor is other than a square.

13. The plenoptic sensor as described in claim 12 wherein the square shape of the photo-sensor has been modified by flattening the vertices of the square closest to the sensor of the same color through the introduction of a vertical line that removes the active area of the analog leaving the active area as a hexagon.

14. The plenoptic sensor as described in claim 12 wherein the active area of photo-sensitive cell has reduced dimensions of the square at its apex through the introduction of a triangle that penetrates from an old vertex of the square to the middle of the square.

15. The plenoptic sensor as described in claim wherein an area where photo-sensitive cell is absent has reduced dimensions of the square at its apex through the introduction of a "staircase triangle" that penetrates from the old corner of the square to the central square, said triangle built by vertical and horizontal lines, at 45 degrees or any other permitted by the rules of design geometry technology photo-sensor.

16. The plenoptic sensor as described in claim 1 wherein the material of low refractive index located on the substrate photo-sensors or located on the pixel microlenses located on the substrate is a meta material or a material with a lower refractive index with the aim of reducing the distance between the plenoptic lenses and substrate, or the distance between the plenoptic lenses and pixel microlenses.

17. The plenoptic sensor as set forth in claim 1 wherein the layers of low refractive index are added successively, and the layers of high refractive index are added successively, repeating the process several times to form a microlens composed of a variety of lenses of any shape regardless of the order of the layers of lenses and/or microlenses.

18. The plenoptic sensor as set forth in claim 17 in which the material of low refractive index is a meta-material or a material with an index of refraction less than one.

19. The plenoptic sensor as described in claim 1 wherein the plenoptic lenses are designed in asymmetric profiles as they are placed at greater distances from a center of a "plenoptic array" in order to improve efficiency in the most remote areas from the center of the photo-sensor.

20. The plenoptic sensor as described in claim 1 wherein the microlenses are designed so that the distances to the substrate are gradually smaller as they are located at greater distances from a center of a "plenoptic array" in order to improve efficiency in the most remote areas from the center of the photo-sensor, the microlenses being constructed slightly inclined as they move away from the center of the plenoptic array, and only the microlenses in the center of the array are perpendicular, or quasi-perpendicular to an optical axis.

* * * * *